United States Patent
Sun et al.

(10) Patent No.: US 10,411,833 B2
(45) Date of Patent: Sep. 10, 2019

(54) EARLY TERMINATION TECHNIQUES FOR SUCCESSIVE DECODING PROCESSES

(71) Applicant: QUALCOMM Incorporated, San Diego, CA (US)

(72) Inventors: Thomas Sun, San Diego, CA (US); Alexei Yurievitch Gorokhov, San Diego, CA (US); Hari Sankar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 15/662,012

(22) Filed: Jul. 27, 2017

(65) Prior Publication Data

US 2018/0034589 A1    Feb. 1, 2018

Related U.S. Application Data

(60) Provisional application No. 62/368,418, filed on Jul. 29, 2016.

(51) Int. Cl.
*H03M 13/13* (2006.01)
*H04L 1/00* (2006.01)
(Continued)

(52) U.S. Cl.
CPC .......... *H04L 1/0061* (2013.01); *H03M 13/09* (2013.01); *H03M 13/091* (2013.01);
(Continued)

(58) Field of Classification Search
CPC .................................................... H03M 13/11
(Continued)

(56) References Cited

U.S. PATENT DOCUMENTS

| 6,282,683 B1 * | 8/2001 | Dapper | G06F 17/14 348/E7.07 |
| 6,336,201 B1 * | 1/2002 | Geile | G06F 17/14 714/755 |

(Continued)

FOREIGN PATENT DOCUMENTS

| CN | 101847999 B | 10/2012 |
| EP | 2899912 A1 | 7/2015 |

OTHER PUBLICATIONS

Guo et al., "Multi-CRC Polar Codes and Their Applications," IEEE Communications Letters, Feb. 2016, 4 pgs., vol. 20, No. 2, Institute of Electrical and Electronics Engineers.

(Continued)

*Primary Examiner* — Fritz Alphonse
(74) *Attorney, Agent, or Firm* — Holland & Hart LLP

(57) ABSTRACT

Methods, systems, and devices for wireless communication are described. A wireless device may initiate a successive decoding process for an encoded code block received at the wireless device, and generate, using a successive decoder, one or more candidate paths for a first portion of the code block, where the first portion of the code block includes a first data portion and a first data check portion. The wireless device may then perform a checking function on respective first data portions for the one or more candidate paths using respective first data check portions, and determine whether to terminate the successive decoding process prior to completing decoding of the encoded code block based at least in part on determining whether the checking function for each of the one or more candidate paths for the first data portion has failed the checking function.

52 Claims, 11 Drawing Sheets

(51) Int. Cl.
*H03M 13/09* (2006.01)
*H03M 13/29* (2006.01)
*H03M 13/37* (2006.01)
*H03M 13/00* (2006.01)

(52) U.S. Cl.
CPC ....... *H03M 13/13* (2013.01); *H03M 13/2906* (2013.01); *H03M 13/3738* (2013.01); *H03M 13/6502* (2013.01); *H04L 1/0045* (2013.01); *H04L 1/0052* (2013.01); *H04L 1/0057* (2013.01)

(58) Field of Classification Search
USPC ......................................... 714/758, 761, 759
See application file for complete search history.

(56) References Cited

U.S. PATENT DOCUMENTS

| 8,261,175 B2 | 9/2012 | Wang et al. |
| 2005/0160316 A1* | 7/2005 | Shipton ................ B41J 2/04505 714/22 |
| 2009/0217124 A1* | 8/2009 | Litsyn ................ G06F 11/1068 714/752 |
| 2014/0173381 A1 | 6/2014 | Lee et al. |
| 2016/0013810 A1 | 1/2016 | Gross et al. |
| 2017/0005996 A1 | 1/2017 | Yu et al. |

OTHER PUBLICATIONS

ISA/EP, International Search Report and Written Opinion of the International Searching Authority, Int'l Application No. PCT/US2017/044414, dated Nov. 7, 2017, European Patent Office, Rijswijk, NL, 16 pgs.

Qualcomm Incorporated, "Early Termination for Polar Codes," 3GPP TSG-RAN WG1 Meeting #89, R1-1709782, Hangzhou, P.R. China, May 15-19, 2017, 18 pgs., XP051285537, 3rd Generation Partnership Project.

Zhou et al., "Segmented CRC-Aided SC List Polar Decoding," 2016 IEEE 83rd Vehicular Technology Conference, May 15, 2016, 5 pgs., XP032918751, DOI: 10.1109/VTCSPRING.2016.7504469, Institute of Electrical and Electronics Engineers.

IPEA/EP, Second Written Opinion of the International Preliminary Examining Authority, Int'l Application No. PCT/US2017/044414, dated Jun. 22, 2018, European Patent Office, Munich, DE, 7 pgs.

Sarkis G., et al., "Increasing the Speed of Polar List Decoders", IEEE Workshop on Signal Processing Systems (SiPS), 2014, pp. 1-6.

\* cited by examiner

500

EARLY TERMINATION TECHNIQUES FOR SUCCESSIVE DECODING PROCESSES

CROSS REFERENCES

The present Application for Patent claims priority to U.S. Provisional Patent Application No. 62/368,418 by SUN, et al., entitled "EARLY TERMINATION TECHNIQUES FOR SUCCESSIVE DECODING PROCESSES," filed Jul. 29, 2016, assigned to the assignee hereof.

BACKGROUND

The following relates generally to wireless communication at a wireless device, and more specifically to early termination techniques for successive decoding processes.

Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, and orthogonal frequency-division multiple access (OFDMA) systems.

By way of example, a wireless multiple-access communication system may include a number of base stations, each simultaneously supporting communication for multiple communication devices, otherwise known as user equipments (UEs). A base station may communicate with UEs on downlink channels (e.g., for transmissions from a base station to a UE) and uplink channels (e.g., for transmissions from a UE to a base station).

Code blocks may be encoded by a transmitting device (e.g., a base station or UE) using an encoding algorithm. Error correcting codes may be used to introduce redundancy in a code block so that transmission errors may be detected and corrected. Some examples of encoding algorithms with error correcting codes include convolutional codes (CCs), low-density parity-check (LDPC) codes, and polar codes. Encoded code blocks may be decoded by a receiver to recover the code block. Certain decoders (e.g., turbo decoders) may be able to achieve high error correction and high capacity, but may require iterative decoding that has a non-determinative decoding latency. A decoded code block may be verified using a checking function like a cyclic redundancy check (CRC) of data bits of the code block based on check bits contained in the code block. Power consumption and decoding time, as well as capacity, are important in decoder implementations for wireless devices (e.g., base stations and UEs) that receive encoded code blocks in wireless communications networks. Verification of the data portion of an encoded code block after the decoding of the entire encoded code block may require the entire decoded code block to be discarded, such that decoding processing resources are wasted, slowing down the decoding process, increasing power consumption, and lowering overall capacity.

SUMMARY

The described techniques relate to improved methods, systems, devices, or apparatuses that support early termination techniques for successive (e.g., serial) decoding processes. Generally, the described techniques provide for decoding an encoded code block at a wireless device, which may be a base station, user equipment (UE), or other wireless device, where the wireless device may terminate the decoding process if it determines, prior to completing the decoding process, that candidate paths tracked for decoding of the encoded code block will fail an error checking process. The wireless device may receive an encoded code block at a wireless device and initiate a decoding process to recover the code block. The code block may include data portions and data check portions (e.g., including one or more cyclic redundancy check (CRC) bits generated from the data portions by the encoder). Using a decoder, the wireless device can generate one or more candidate paths for a first portion of the encoded code block, including a first data portion and a first data check portion. The wireless device may then perform a checking function (e.g., a CRC algorithm) on the candidate paths for the first data portion using the respective first data check portion. The wireless device may then determine whether the checking function for each of the one or more candidate paths for the first data portion of the encoded code block has passed or failed the checking function. Based on the passing or failing of these candidate paths, the wireless device may determine whether to terminate the decoding process prior to completing decoding of the encoded code block.

The encoded code block may have a first portion, including the first data and data check portions, that is before a second portion of the encoded code block, which may include one or more additional data portions and one or more data check portions. The decoder may generate one or more candidate paths for the second portion of the encoded code block while the checking function is determining passing or failing for the candidate paths for the first data portion. Where each of the candidate paths for the first data portion fail the checking function, decoding of the encoded code block may terminate while the decoder is generating one or more candidate paths for the second portion. Early termination may save time, power, and processing resources by allowing the wireless device to stop decoding encoded code blocks where successful decoding of the entire code block may be impossible.

The code block may have a plurality of data portions and a plurality of data check portions, each data check portion following a respective data portion. In some examples, the code block may have three, four, or more data and data check portions. The data portions may be equally or differently sized, and the data check portions may also be equally or differently sized. In some examples, the decoder may be one or more of a serial decoder, a serial list decoder, a successive cancellation decoder, or a successive cancellation list decoder, or another decoder implementing a polar code, convolutional code (CC), or other non-backtracking decoding algorithm to decode encoded code blocks.

A method of wireless communication is described. The method may include initiating a successive decoding process for an encoded code block received at the wireless device and generating, using a successive decoder, one or more candidate paths for a first portion of the code block, wherein the first portion of the code block comprises a first data portion and a first data check portion. The method may further include performing a checking function on respective first data portions for the one or more candidate paths using respective first data check portions and determining whether to terminate the successive decoding process prior to completing decoding the code block based at least in part on determining whether the checking function for each of the one or more candidate paths for the first data portion has failed the checking function.

An apparatus for wireless communication is described. The apparatus may include means for initiating a successive decoding process for an encoded code block received at the wireless device and means for generating, using a successive decoder, one or more candidate paths for a first portion of the code block, wherein the first portion of the code block comprises a first data portion and a first data check portion. The apparatus may further include means for performing a checking function on respective first data portions for the one or more candidate paths using respective first data check portions and means for determining whether to terminate the successive decoding process prior to completing decoding the code block based at least in part on determining whether the checking function for each of the one or more candidate paths for the first data portion has failed the checking function.

Another apparatus for wireless communication is described. The apparatus may include a processor, memory in electronic communication with the processor, and instructions stored in the memory. The instructions may be operable to cause the processor to initiate a successive decoding process for an encoded code block received at the wireless device and generate, using a successive decoder, one or more candidate paths for a first portion of the code block, wherein the first portion of the code block comprises a first data portion and a first data check portion. The instructions may be further operable to cause the processor to perform a checking function on respective first data portions for the one or more candidate paths using respective first data check portions and determine whether to terminate the successive decoding process prior to completing decoding the code block based at least in part on determining whether the checking function for each of the one or more candidate paths for the first data portion has failed the checking function.

A non-transitory computer readable medium for wireless communication is described. The non-transitory computer-readable medium may include instructions operable to cause a processor to initiate a successive decoding process for an encoded code block received at the wireless device and generate, using a successive decoder, one or more candidate paths for a first portion of the code block, wherein the first portion of the code block comprises a first data portion and a first data check portion. The non-transitory computer-readable medium may include instructions further operable to cause the processor to perform a checking function on respective first data portions for the one or more candidate paths using respective first data check portions and determine whether to terminate the successive decoding process prior to completing decoding the code block based at least in part on determining whether the checking function for each of the one or more candidate paths for the first data portion has failed the checking function.

Some examples of the method, apparatus, and non-transitory computer-readable medium described above may further include processes, features, means, or instructions for generating, using the decoder, a second one or more candidate paths for a second portion of the code block, wherein the second portion of the encoded code block comprises a second data portion and a second data check portion. Some examples of the method, apparatus, and non-transitory computer-readable medium described above may further include processes, features, means, or instructions for performing the checking function on respective second data portions for the one or more candidate paths for the second portion using respective second data check portions. Some examples of the method, apparatus, and non-transitory computer-readable medium described above may further include processes, features, means, or instructions for determining whether to terminate the successive decoding process prior to completing decoding the code block based at least in part on determining whether the checking function for each of the one or more candidate paths for the second data portion has failed the checking function.

Some examples of the method, apparatus, and non-transitory computer-readable medium described above may further include processes, features, means, or instructions for generating a second one or more candidate paths for the second portion of the code block, wherein the second portion of the encoded code block comprises a second data portion and a second data check portion, and wherein the second one or more candidate paths may be initialized from the first one or more candidate paths. In some examples of the method, apparatus, and non-transitory computer-readable medium described above, the generating of at least a part of the second one or more candidate paths may be performed concurrently with performing the checking function on the respective first data portions for the one or more candidate paths using the respective first data check portions. In some examples of the method, apparatus, and non-transitory computer-readable medium described above, the second one or more candidate paths may be initialized from a subset of the first one or more candidate paths for which the checking function has passed.

In some examples of the method, apparatus, and non-transitory computer-readable medium described above, the encoded code block comprises a plurality of data portions, including the first data portion, and a plurality of data check portions associated with respective ones of the plurality of data portions, including the first data check portion. In some examples of the method, apparatus, and non-transitory computer-readable medium described above, each of the plurality of data portions may be a same size. In some examples of the method, apparatus, and non-transitory computer-readable medium described above, at least one of the plurality of data portions may have a different size than at least one other data portion of the plurality of data portions. In some examples of the method, apparatus, and non-transitory computer-readable medium described above, each of the plurality of data check portions may have a same number of data check bits. In some examples of the method, apparatus, and non-transitory computer-readable medium described above, at least one of the plurality of data check portions may have a different number of data check bits than at least one other data check portion of the plurality of data check portions.

In some examples of the method, apparatus, and non-transitory computer-readable medium described above, the one or more candidate paths comprise a plurality of candidate paths. In some examples of the method, apparatus, and non-transitory computer-readable medium described above, the checking function comprises a CRC. In some examples of the method, apparatus, and non-transitory computer-readable medium described above, the decoder comprises a polar decoder or a CC decoder. In some examples of the method, apparatus, and non-transitory computer-readable medium described above, the decoder implements a non-backtracking decoding algorithm. Some examples of the method, apparatus, and non-transitory computer-readable medium described above may further include processes, features, means, or instructions for receiving a control channel of a wireless transmission, wherein the encoded code block may be received in the control channel.

DETAILED DESCRIPTION

Figure 1:
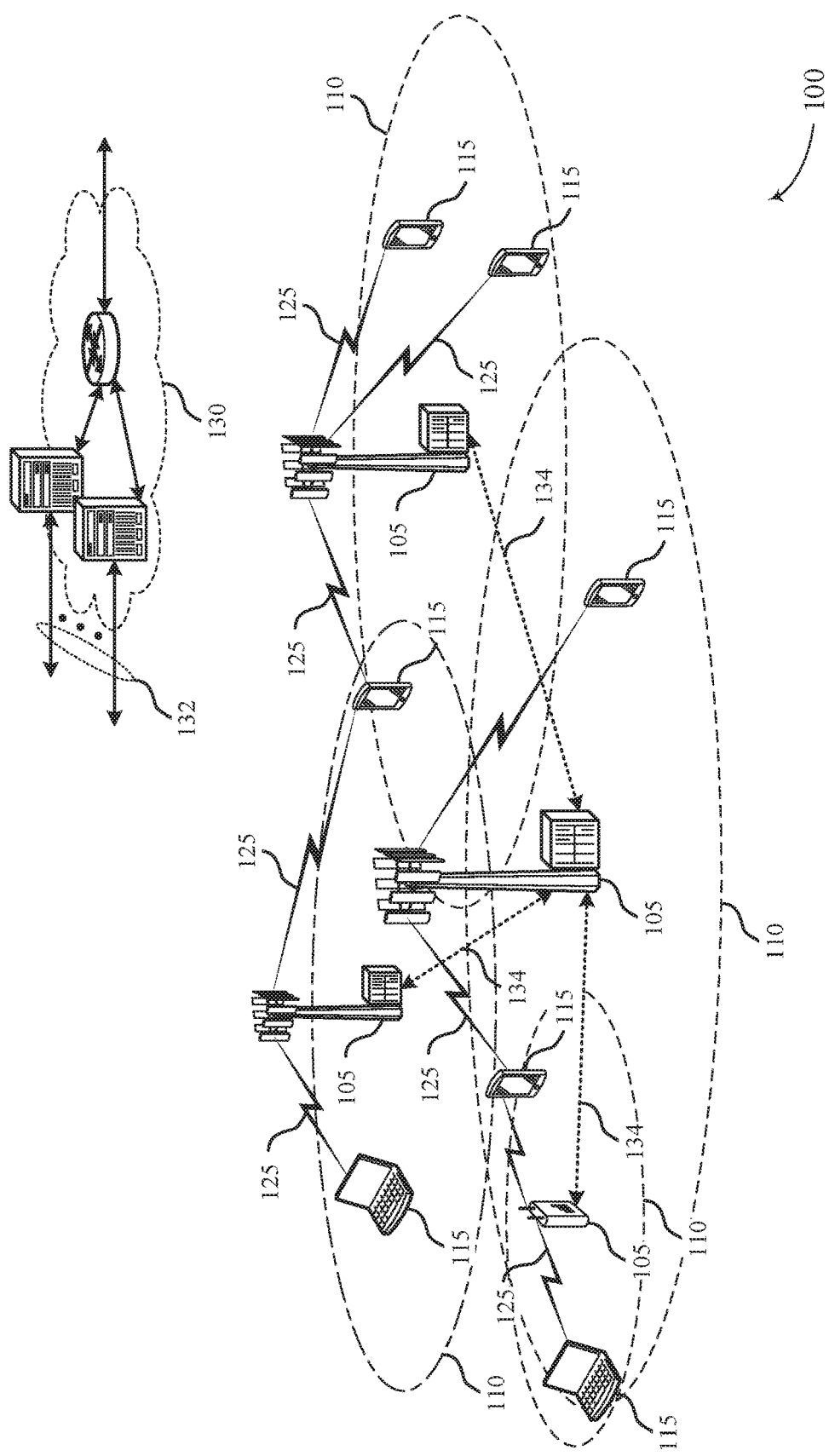
FIG. 1 illustrates an example of a wireless communication system that supports early termination techniques for successive decoding processes in accordance with various aspects of the present disclosure.

Power consumption and decoding time, as well as capacity, are important in decoder implementations for wireless devices, such as base stations and user equipments (UEs) that receive encoded code blocks in wireless communications networks. Such wireless devices may also implement decoding using error correction codes to verify the correctness of the decoding of data included in an encoded code block. The error correction codes may use one or more check bits in the encoded code block for such purposes. Examples of error correction codes (e.g., capacity-achieving or capacity-approaching error correction codes) include turbo codes, low-density parity-check (LDPC) codes, convolutional codes (CCs), and polar codes. Some error correction codes including CCs and polar codes may be decoded using a successive decoder. A successive decoder uses a non-iterative and non-backtracking decoding algorithm and may also be called a serial decoder. List decoders, instead of outputting a single possible candidate, may output a list of possible candidates, one of which may be correct. List decoders may be successive (e.g., a list serial decoder, etc.).

Wireless devices of a wireless communications system may decode encoded code blocks having a data portion and a data check portion, including check bits such as one or more cyclic redundancy check (CRC) bits, corresponding to the data portion. The check bits may be used to verify whether the data portion has been correctly received by the wireless device. If the checking function indicates success, the encoded code block may be retained by the receiving wireless devices, but if the checking function of all paths indicates failure, the encoded code block may be discarded.

Early termination techniques for successive decoding processes are further described below. Aspects of the disclosure are initially described in the context of a wireless communications system. Aspects of the disclosure are further illustrated by and described with reference to apparatus diagrams, system diagrams, and flowcharts that relate to early termination techniques for successive decoding processes. According to various aspects, a code block may contain multiple data portions and multiple data check portions corresponding to the multiple data portions. The encoded code block may be received by a wireless device, and a decoder (e.g., a polar decoder or a CC decoder that may implement a non-backtracking and non-iterative decoding algorithm) may begin a decoding process for the encoded code block. Using the decoder, the wireless device may generate one or more candidate paths for a first portion of the code block, including a first data portion and a first data check portion. The wireless device may then perform a checking function (e.g., a CRC algorithm) on the candidate paths for the first data portion using the respective first data check portion. The wireless device may determine whether the checking function for each of the one or more candidate paths for the first data portion of the encoded code block has passed or failed the checking function. The decoding process may also continue for a second portion (which may include a second data portion and a second data check portion) while performing the checking function on the candidate paths for the first data portion. Based on the passing or failing of these candidate paths, the wireless device may determine whether to terminate the decoding process, which may be during the process of generating candidate paths for the second portion or a subsequent portion of the encoded code block, prior to completing decoding of the encoded code block.

Due at least in part to the serial successive nature of the decoding process, the checking function may be performed on the fly and the checking function may complete checking the first portion prior to decoding the second portion of the code block, for example allowing the wireless device to stop decoding where successful decoding of the entire code block may be impossible. Early termination may save power, decoding time, and processing resources, while increasing overall data capacity.

FIG. 1 illustrates an example of a wireless communications system 100 that supports early termination techniques for successive decoding processes in accordance with various aspects of the present disclosure. In some examples, the wireless communications system 100 may be a long term evolution (LTE) or LTE-Advanced network. The wireless communications system 100 includes base stations 105, UEs 115, and a core network 130. The core network 130 may provide user authentication, access authorization, tracking, Internet Protocol (IP) connectivity, and other access, routing, or mobility functions. The base stations 105 interface with the core network 130 through backhaul links 132 (e.g., S1, etc.) and may perform radio configuration and scheduling for communication with the UEs 115, or may operate under the control of a base station controller (not shown). In various examples, the base stations 105 may communicate, either directly or indirectly (e.g., through core network 130), with each other over backhaul links 134 (e.g., X1, etc.), which may be wired or wireless communication links.

The base stations 105 may wirelessly communicate with the UEs 115 via one or more base station antennas. Each of the base station 105 sites may provide communication coverage for a respective geographic coverage area 110. In some examples, base stations 105 may be referred to as a base transceiver station, a radio base station, an access point, a radio transceiver, a NodeB, an evolved NodeB (eNB), a Home NodeB, a Home eNodeB, or some other suitable terminology. The geographic coverage area 110 for a base station 105 may be divided into sectors making up only a portion of the coverage area (not shown). The wireless communications system 100 may include base stations 105 of different types (e.g., macro and/or small cell base stations). There may be overlapping geographic coverage areas 110 for different technologies.

In some examples, the wireless communications system 100 is an LTE/LTE-A network. In LTE/LTE-A networks, the term eNB may be generally used to describe the base stations 105, while the term UE may be generally used to describe the UEs 115. The wireless communications system 100 may be a Heterogeneous LTE/LTE-A network in which different types of eNBs provide coverage for various geographical regions. For example, each eNB or base station 105 may provide communication coverage for a macro cell, a small cell, and/or other types of cell. The term "cell" is a 3GPP term that can be used to describe a base station, a carrier or component carrier associated with a base station, or a coverage area (e.g., sector, etc.) of a carrier or base station, depending on context.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell may cover a relatively smaller geographic area and may allow unrestricted access by UEs with service subscriptions with the network provider. A femto cell also may cover a relatively small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB or a home eNB. An eNB may support one or multiple (e.g., two, three, four, and the like) cells (e.g., component carriers).

The wireless communications system 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The communication networks that may accommodate some of the various disclosed examples may be packet-based networks that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) protocol to provide retransmission at the MAC layer to improve link efficiency. In the control plane, the Radio Resource Control (RRC) protocol layer may provide establishment, configuration, and maintenance of an RRC connection between a UE 115 and the base stations 105 or core network 130 supporting radio bearers for the user plane data. At the Physical (PHY) layer, the transport channels may be mapped to Physical channels. Downlink physical channels may include a physical broadcast channel (PBCH) for broadcast information, physical control format indicator channel (PCFICH) for control format information, physical downlink control channel (PDCCH) for control and scheduling information, physical HARQ indicator channel (PHICH) for HARQ status messages, physical downlink shared channel (PDSCH) for user data and physical multicast channel (PMCH) for multicast data. Uplink physical channels may include a physical random access channel (PRACH) for access messages, physical uplink control channel (PUCCH) for control data, and physical uplink shared channel (PUSCH) for user data.

The UEs 115 are dispersed throughout the wireless communications system 100, and each UE 115 may be stationary or mobile. A UE 115 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may be a cellular phone, a personal digital assistant (PDA), a wireless modem, a wireless communication device, a handheld device, a tablet computer, a laptop computer, a cordless phone, a wireless local loop (WLL) station, or the like. A UE may be able to communicate with various types of base stations and network equipment including macro eNBs, small cell eNBs, relay base stations, and the like.

The communication links 125 shown in wireless communications system 100 may include uplink transmissions from a UE 115 to a base station 105, and/or downlink transmissions, from a base station 105 to a UE 115. The downlink transmissions may also be called forward link transmissions while the uplink transmissions may also be called reverse link transmissions. Each communication link 125 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. The communication links 125 may transmit bidirectional communications using frequency division duplexing (FDD) (e.g., using paired spectrum resources) or time division duplexing (TDD) operation (e.g., using unpaired spectrum resources). Frame structures for FDD (e.g., frame structure type 1) and TDD (e.g., frame structure type 2) may be defined.

In some embodiments of the wireless communications system 100, base stations 105 and/or UEs 115 may include multiple antennas for employing antenna diversity schemes to improve communication quality and reliability between base stations 105 and UEs 115. Additionally or alternatively, base stations 105 and/or UEs 115 may employ multiple-input, multiple-output (MIMO) techniques that may take advantage of multi-path environments to transmit multiple spatial layers carrying the same or different coded data.

Wireless communications system 100 may support operation on multiple cells or carriers, a feature which may be referred to as carrier aggregation (CA) or multi-carrier operation. A carrier may also be referred to as a component carrier, a layer, a channel, etc. The terms "carrier," "component carrier," "cell," and "channel" may be used interchangeably herein. A UE 115 may be configured with multiple downlink component carriers and one or more uplink component carriers for carrier aggregation. Carrier aggregation may be used with both FDD and TDD component carriers.

The wireless communications system 100 may support forward error correction (FEC) for use in improving throughput and reliability in channels with varying signal-to-noise ratio (SNR). Types of codes used in FEC include CCs, polar codes, turbo codes, LDPC codes, and the like. Generally, the decoder attempts to select a code word with a maximum likelihood of being the code word that was sent, based on the received symbol information and properties of code words inherent to the encoding scheme. List decoders may output a list of possible candidates, one of which may be correct, and such decoders may be non-backtracking or non-iterative. An inner decoder may output a list of candidate sequences based on multiple candidate paths, the candidate sequences including both data candidates and data check candidates. The checking function processor may perform a checking function, for example a CRC, on the list of candidate sequences, using the data check candidate bits to check the data candidate bits.

Components of the wireless communications system 100 including the base stations 105 or UEs 115 may implement early termination techniques for successive decoding processes. An encoded code block may contain multiple data portions and multiple data check portions corresponding to the multiple data portions. For example, the encoded code block may contain a first data portion, a first data check portion, a second data portion, and a second data check portion. In part because the early termination decoder described herein may be non-backtracking, the early termination decoder may generate one or more candidate paths associated with the first data portion and the first data check portion prior to completing decoding of the remainder of the encoded code block, for example prior to decoding the second data and/or data check portions of the encoded code block.

Figure 2:
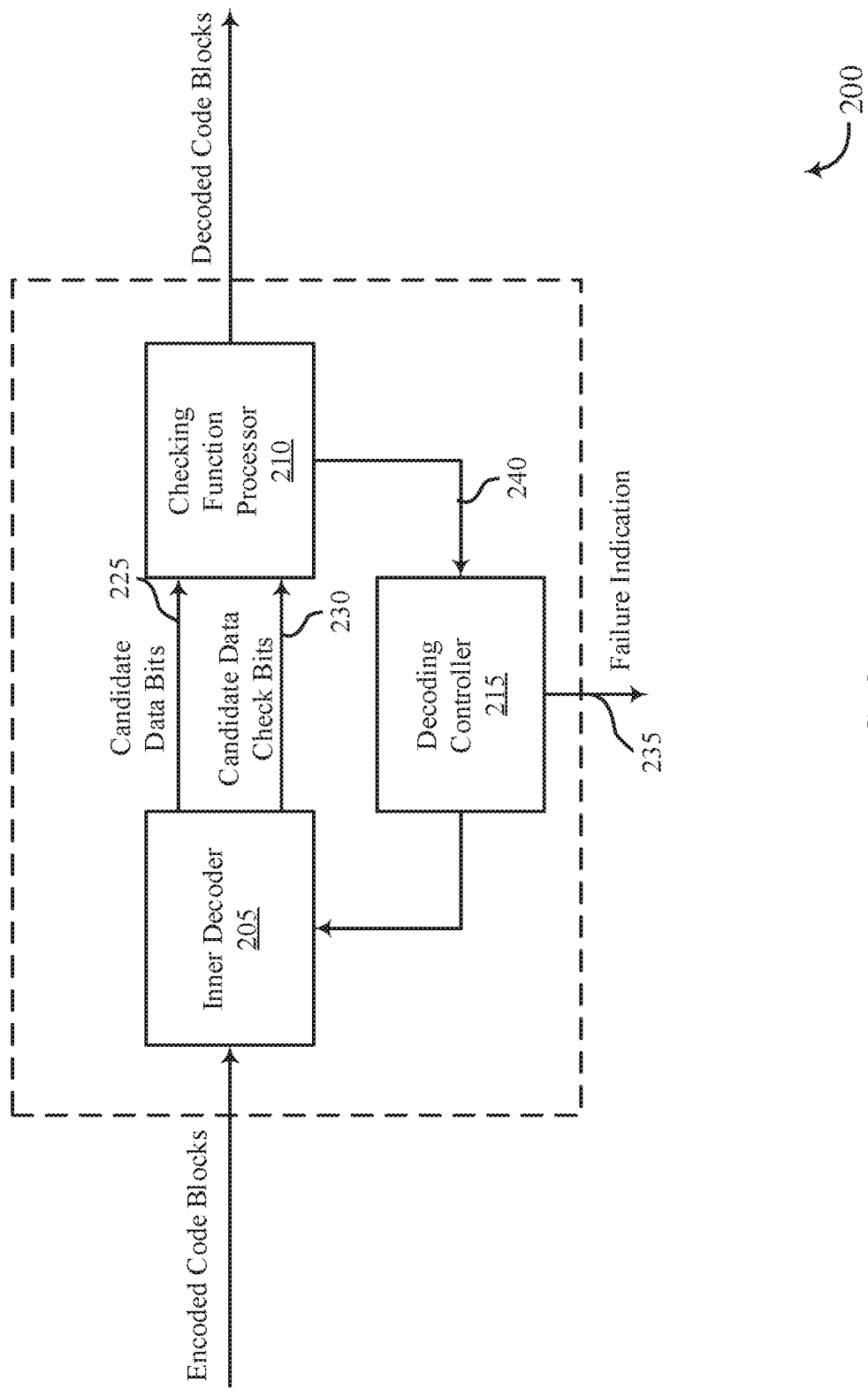
FIG. 2 illustrates an example of a decoder implementing early termination techniques for successive decoding processes in accordance with various aspects of the present disclosure.

FIG. 2 illustrates an example of a decoder 200 implementing early termination techniques for successive decoding processes in accordance with various aspects of the present disclosure. Decoder 200 includes an inner decoder 205, a checking function processor 210, and a decoding controller 215. Decoder 200 receives encoded code blocks and outputs decoded code blocks. Where a checking function fails, the decoder 200, rather than outputting a decoded code block, may output a failure indication 235, for example to signal to other components of a wireless device that a received encoded code block was not successfully decoded and should be ignored or retransmitted from a transmitting device.

The code block before encoding may include a plurality of portions, including a plurality of data check portions corresponding to respective data portions of the encoded code block. In some examples, the code block may have two or more data portions and two or more data check portions, each data check portion corresponding to at least one of the data portions, as further described below with reference to FIGS. 3A-3C. The two or more data portions may be equally or differently sized for the encoded code block, and the two or more data check portions may also be equally or differently sized.

Inner decoder 205 may receive an encoded code block and output candidate data bits 225 and candidate data check bits 230 to checking function processor 210. The inner decoder 205 may be one or more of a serial decoder, serial list decoder, successive cancellation decoder, or successive cancellation list decoder that implements decoding for a polar code, CC, or other non-backtracking decoding algorithm to decode encoded code blocks. Inner decoder 205 may output candidate data bits 225 and candidate data check bits 230 corresponding to data portions of the code block and data check portions of the code block, respectively.

Inner decoder 205 may first output, to the checking function processor 210, a first set of candidate paths corresponding to a first portion of the code block, which may include both a first data portion and a first data check portion. The inner decoder 205 may be non-iterative and/or non-backtracking, such that inner decoder 205 may generate candidate paths for the first portion corresponding to the first data portion and the first data check portion prior to generating candidate paths for a second portion of the code block. The generated candidate paths may have candidate data portions including a number of candidate data bits 225 and candidate data check portions including a number of candidate data check bits 230. Each of the candidate data bits 225 and the candidate data check bits 230 may be provided to the checking function processor 210 while inner decoder 205 continues the decoding process, for example for a second portion of the code block, which may include a second data portion and a second data check portion. In other cases, inner decoder 205 may pause and wait for an indication of one or more successful checking functions for candidate paths before continuing the decoding process.

Checking function processor 210 may perform a checking function on a set of candidate data bits 225 using a respective set of candidate data check bits 230 associated with a candidate path. In some examples, checking function processor 210 may implement an error-detecting code (e.g., a CRC error detection algorithm), which may also be used by a transmitting device when generating the check data portions of the code block from a code block. The candidate data check bits 230 of a candidate data path may be used to perform a checking function for the corresponding candidate data bits 225 of the candidate data path, for each of the candidate data paths. Where the inner decoder 205 has output candidate data bits 225 and candidate data check bits 230 for a first portion of the code block, the checking function processor 210 may perform a checking function on the candidate paths for the first portion of the code block while the decoder continue to decode another portion of the code block having data and data check portions, such as a second, third, fourth, etc., portion.

After performing a checking function for each of the candidate data paths, checking function processor 210 may output an indication 240 of the success or failure of the checking function for each of the candidate paths to a decoding controller 215. Alternatively, checking function processor 210 may output a single indication that all the checking functions have failed for the candidate data paths or an indication that less than all of the checking functions have failed for the candidate data paths. The checking function processor 210 may buffer the candidate data bits 225 for the candidate paths, and discard the candidate data check bits 230 after they have been used by the error-detecting code to perform the checking function.

The decoding controller 215 may receive one or more indications of success or failure from the checking function performed by checking function processor 210. Based on the one or more indications, the decoding controller 215 may control the inner decoder 205 to terminate decoding the remaining portion of the encoded code block. Such an early termination may reduce power consumption at the decoder 200, for example, when SNR is low (e.g., below a certain threshold). Decoding controller 215 may also output a failure indication from the decoder 200. The failure indication may, for example, signal to other components of a wireless device that a received encoded code block was not successfully decoded and should be ignored or retransmitted from a transmitting device.

Figure 3A:
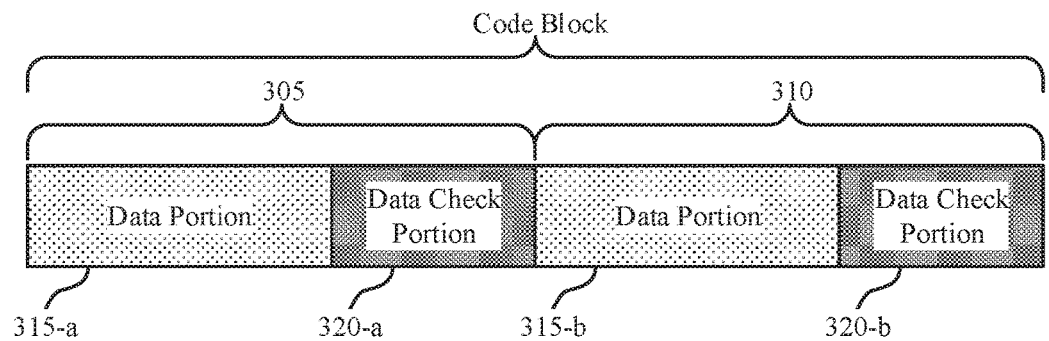
FIGS. 3A through 3C illustrate examples of encoded code block formats to implement early termination techniques for successive decoding processes in accordance with various aspects of the present disclosure.
Figure 3B:
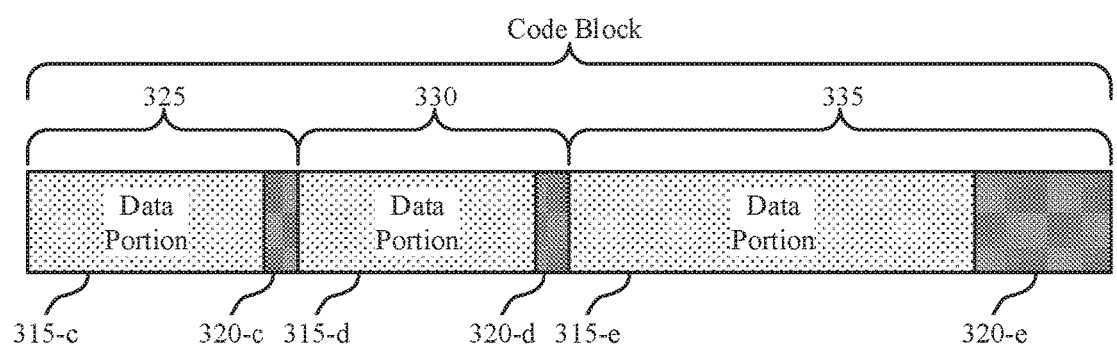
Figure 3C:
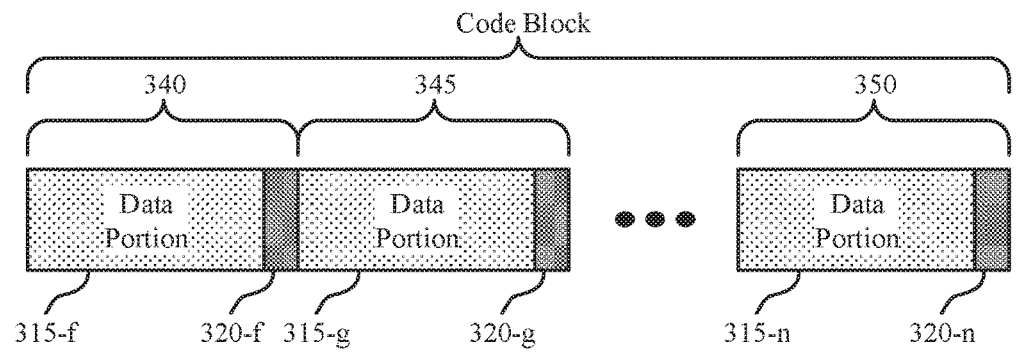

FIGS. 3A through 3C illustrate examples of code block formats to implement early termination techniques for successive decoding processes in accordance with various aspects of the present disclosure. The code block formats may be used, for example, by a transmitting device (e.g., a UE 115, a base station 105, or another wireless device, as described with reference to FIG. 1) to encode a code block for transmission to a receiving device (e.g., which may also be a UE 115, a base station 105, or another wireless device). The receiving device may use a decoder 200 as illustrated with reference to FIG. 2 to decode such encoded code blocks.

FIG. 3A illustrates a first example of a code block format 301 to implement early termination techniques for successive decoding processes. The code block format 301 may include a first portion 305 having a first data portion 315-$a$ and a first data check portion 320-$a$, and may include a second portion 310 having a second data portion 315-$b$ and a second data check portion 320-$b$.

A non-iterative or non-backtracking decoder may be used to decode the encoded code block. As the encoded code block begins a decoding process, candidate data bits and candidate data check bits for a number of candidate paths associated with the first portion 305 of the code block may be generated. At least in part because the decoder performs serial or successive decoding, the candidate data bits and candidate data check bits associated with the first portion 305 may be available to perform a checking function as soon as decoding of the first portion 305 is complete. Thus, a result of the checking function (e.g., a CRC function) may be available as soon as the decoding process of the first portion 305 is complete. Where the result of the checking function is not immediately available, or where parallel processing resources are available for the successive decoding process and the checking function process, the decoder may proceed to generate candidate data bits for the second data portion 315-$b$ while at the same time the checking function for the first portion 305 is being performed. For example, the checking function may complete prior to when the decoder finishes decoding a second portion 310 of the encoded code block.

The checking function may be performed on the candidate data bits using respective candidate data check bits for the candidate paths. If the checking function indicates that all of the candidate paths are associated with a failed checking function, the decoder may stop decoding prior to completing decoding of the second portion 310 of the code block, and move on to decoding a following or next code block. In some examples, because all of the candidate paths result in a failed checking function, it may be that there is no possible combination of candidate paths associated with the second portion 310 that would result in a successful checking function result for the code block when performing the checking function on candidate data bits associated with the first data portion 315-$a$ and second data portion 315-$b$ using the second data check portion 320-$b$.

In some examples, first data portion 315-$a$ may include a first one half of the total data bits of the code block and second data portion 315-$b$ may include a second one half of the total data bits of the code block. In other examples, the first data portion 315-$a$ may include one-fourth of the total data bits of the encoded code block and the second data portion 315-$b$ may include the remaining three-fourths of the total data bits of the code block. In other examples, differently sized divisions of the data bits of the code block may be used to create two or more data portions of the code block.

In some examples, first data check portion 320-$a$ may include data check bits to be input to a checking function for the first data portion 315-$a$, and the second data check portion 320-$b$ may include data check bits to be input to a checking function for both the first data portion 315-$a$ and the second data portion 315-$b$. In some examples, the respective sizes of the first data check portion 320-$a$ and second data check portion 320-$b$ may be based on the sizes (e.g., the number of bits) of the first data portion 315-$a$ and the total of the first data portion 315-$a$ and the second data portion 315-$b$, respectively. In one example, a first data check portion 320-$a$ may be four bits in length, and a second data check portion 320-$b$ may be twenty-four bits in length.

FIG. 3B illustrates a second example of a code block format 302 to implement early termination techniques for successive decoding processes. The code block may include a first portion 325 having a first data portion 315-$c$ and a first data check portion 320-$c$, a second portion 330 having a second data portion 315-$d$ and a second data check portion 320-$d$, and a third portion 335 having a third data portion 315-$e$ and a third data check portion 320-$e$.

In some examples, the candidate data bits and candidate data check bits associated with the first portion 325 may be generated prior to when the decoder finishes decoding a second portion 330 or a third portion 335 of the code block, and a checking function for the first portion 325 may be performed prior to the conclusion of decoding the second portion 330 or the third portion 335. In some examples the decoder may proceed to generate candidate data bits for one or more of the second data portion 315-$c$, the second data check portion 320-$c$, the third data portion 315-$e$, or the third data check portion 320-$e$ while the checking function for the first portion 325 is being performed. If the checking function determines that a check based on the first portion 325 has failed (e.g., because the checking function determines that all the candidate paths associated with the first portion 325 have failed the checking function), decoding of the remainder of the code block may stop, for example before completing decoding of the second portion 330 or the third portion 335.

In some examples, a checking function for the first portion 325 may pass the checking function (e.g., because the checking function determines that less than all the candidate paths associated with the first portion 325 have failed the checking function, or one or more of the candidate paths have passed the checking function), and a checking function for the second portion 330 may proceed. The checking function for the second portion 330 may be performed on the second data portion 315-$d$ using respective second data check portion 320-$d$, while the decoding process may continue for the third portion 335 of the code block. In some cases, the checking function for the second portion 330 may be performed on candidate paths stemming from the one or more candidate paths that passed the checking function for the first portion 325. In these cases, the decoder may not generate any candidate paths stemming from candidate paths that failed the checking function for the first portion 325.

In some examples, first data portion 315-c may include a first one-fourth of the total data bits, second data portion 315-d may include a second one-fourth of the total data bits, and the third data portion 315-e may include the remaining one half of the total data bits of the code block. In other examples, each of the first data portion 315-c, the second data portion 315-d, and the third data portion 315-e may have equal portions of the total data bits.

In some examples, first data check portion 320-c may include data check bits to be input to a checking function for the first data portion 315-c, the second data check portion 320-d may include data check bits to be input to a checking function for the second data portion 315-d, and the third data check portion 320-e may include data check bits to be input to a checking function for all of the first data portion 315-c, the second data portion 315-d, and the third data portion 315-e. In some examples, the respective sizes of the data check portions may be based on the sizes (e.g., the number of bits) of their respective data portions. In one example, a first data check portion 320-c may be four bits in length, a second data check portion 320-d may be four bits in length, and a third data check portion 320-e may be twenty-four bits in length.

FIG. 3C illustrates a third example of a code block format 303 to implement early termination techniques for successive decoding processes. The code block may include N portions, where N is an integer, including a first portion 340 having a first data portion 315-f and a first data check portion 320-f, a second portion 345 having a second data portion 315-g and a second data check portion 320-g, etc., up to an $N^{th}$ portion 350 having an $N^{th}$ data portion 315-n and an $N^{th}$ data check portion 320-n. As candidate paths for the data portions and their respective data check portions are generated by the decoder decoding the encoded code block, a checking function may be performed. For a given portion, if all the candidate paths fail the checking function, decoding may then be terminated. For the given portion, if the checking function passes (e.g., if some of the candidate paths pass the checking function), then the decoding process may continue.

In some examples, code block format 303 having three portions (N=3) may result in greater decoding efficiency than an encoded code block format 303 having four portions (e.g., where N=4), where each code block has the same number of data bits. For N=3, the first data portion may include a first one-fourth of the total data bits, the second data portion may include a second one-fourth, and the third data portion may include the remaining one half of the total data bits. For N=4, each of the four data portions may include one-fourth of the total data bits. As described further herein, if a checking function determines that no candidate paths associated with the data portion and respective data check portions will pass the checking function, then the decoding process may terminate. Where the portion is the first portion 340 of the code block, the processing resources saved may be larger than where the portion is the second portion 345 of the code block. For the described N=4 example, performing a checking function on the third data portion using respective third data check bits may save relatively few cycles and other processing resources, for example because only a small part of the decoding process is yet to be completed. Thus, shortening the length of the encoded code block by leaving out the third data check portion, which may include, for example, two or four check data bits as described above in the N=3 case may be more efficient than the N=4 case. Thus, in one example, it may save cycles and improve efficiency to have, for N=3, a first data check portion of two or four bits, a second data check portion of two or four bits, and a third data check portion of twenty-four bits.

In some examples, higher SNRs may decrease the amount of efficiencies gained from using the above-described code block formats. Because efficiencies may be gained where early termination occurs, a high SNR corresponding to high decoding success rates will reduce the gains of using the above-described code block formats. Conversely, in low SNR environments, significant efficiency gains may be had by using the early termination techniques described herein and using the above-described encoded code block formats.

In some examples, if the checking function (e.g., a CRC check) after each portion passes for one or more paths, the path metric (PM) vector may be reset to include only the paths that have passed the checking function, as those paths that fail are unlikely to succeed for the full code block. Pruning failing candidate paths may increase the likelihood that a decodable path is traversed, thus enhancing block error rate (BLER) performance. In some cases, for example where a number of data check bits for a first portion and a second portion is small (e.g., four check bits), there may be a high false pass rate for these portions. In such cases, a PM vector may be reset after a checking function has been performed for the second portion, but not reset after the checking function has been performed for the first portion. In other examples, increasing the number of data check bits used from four bits to a larger number of bits that provide increased check robustness may be used to reduce a number of false data check pass rates.

A code block may be encoded at the transmitter. In some examples, the encoding algorithm may be a polar encoder. In one example, given a code length $N=2^n$, $n=1, 2, \ldots$, and information length K, the binary source block $\vec{u}=(u_1, u_2, \ldots, u_N)$ includes K information bits and N-K frozen bits. The code word x with code rate R=K/N can be obtained using the following equation: $x=uG_N=uF_2^{\oplus n}$. Where $G_N=F_2^{\oplus n}$ is the generation matrix, $F_2^{\oplus n}$ is the n-th Kronecker power of $F_2$, and $$F_2 = \begin{bmatrix} 1 & 0 \\ 1 & 1 \end{bmatrix}$$

and may be referred to as a kernel matrix. In some examples, the encoding process may be similar to the Walsh-Hadamard transform.

Figure 4:
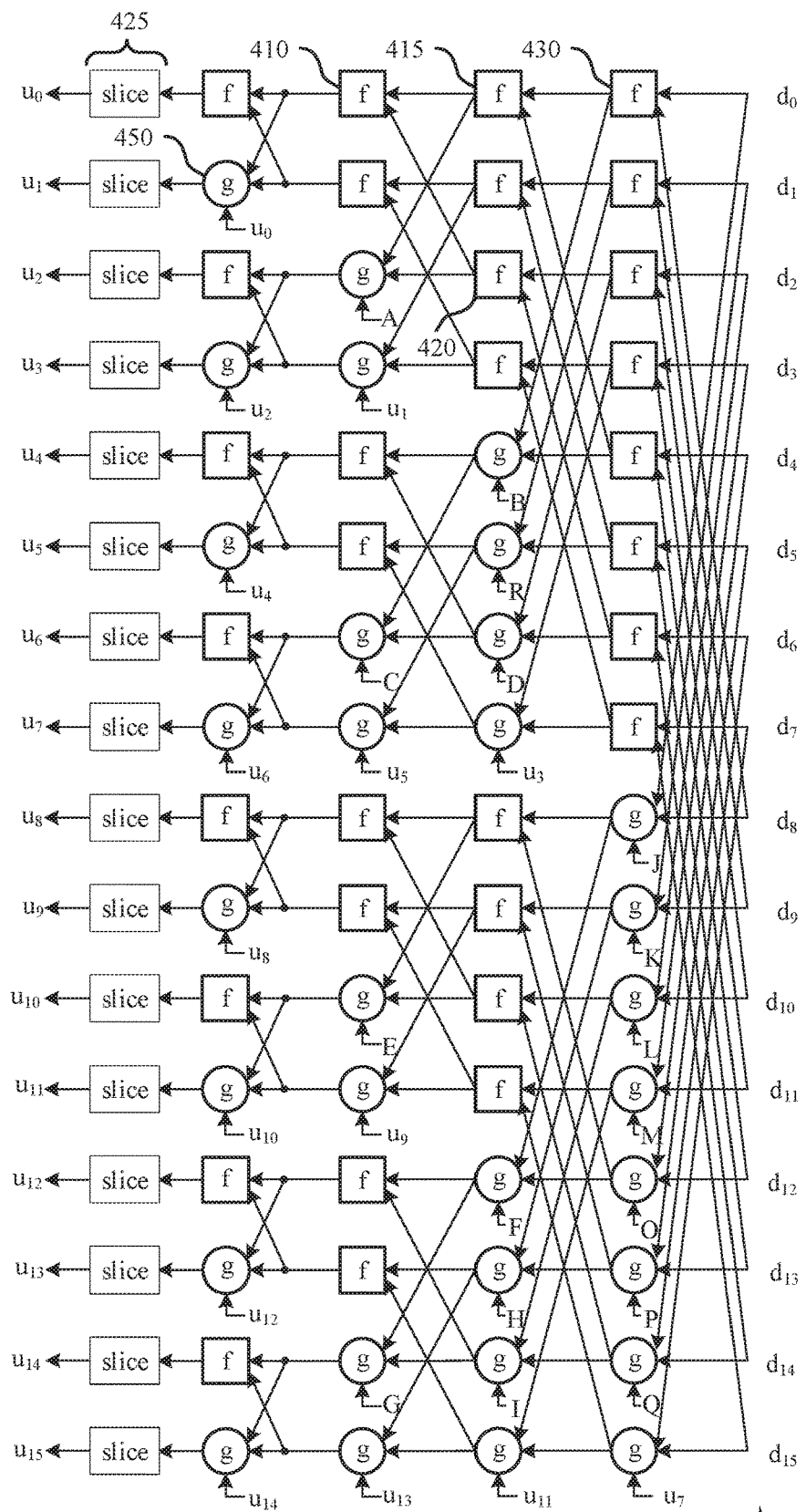
FIG. 4 illustrates an example of a decoding architecture to implement early termination techniques for successive decoding processes in accordance with various aspects of the present disclosure.

FIG. 4 illustrates an example of a decoding architecture 400 to implement early termination techniques for successive decoding processes in accordance with various aspects of the present disclosure. In some examples, decoding architecture 400 may be implemented in inner decoder 205, and/or by a UE 115 or base station 105, as described with respect to FIGS. 1 and 2. The above-described encoding algorithm may be used in conjunction with a decoding architecture 400, for example where an encoded code block may have been encoded according to the above-described encoding algorithm.

Decoding architecture 400 in this example includes a code length of N=16, which may decode a code block of length N=16. Decoding architecture 400 may be referred to as a butterfly architecture, and is part of an example of a polar decoder, and may be an illustration of successive cancellation decoding. This example describes only one example of a decoding architecture for inner decoder 205 and may be applied more broadly. For example, either or both of the encoding algorithm described above and decoding architecture 400 may include different code lengths and may encode and decode code blocks of different lengths.

Decoding architecture 400 shows the decoder input (e.g., soft inputs) $d_0, d_1, \ldots, d_{15}$ and hard decision bit output $u_0, u_1, \ldots, u_{15}$. The equations of variable A through R that are inputs in decoding architecture 400 may be as given by the following:

$$A = u_0 \oplus u_1;$$

$$C = u_4 \oplus u_5;$$

$$E = u_8 \oplus u_9;$$

$$G = u_{12} \oplus u_{13};$$

$$B = u_0 \oplus u_1 \oplus u_2 \oplus u_3;$$

$$R = u_1 \oplus u_3;$$

$$D = u_2 \oplus u_3;$$

$$F = u_8 \oplus u_9 \oplus u_{10} \oplus u_{11};$$

$$H = u_9 \oplus u_{11};$$

$$I = u_{10} \oplus u_{11};$$

$$J = u_0 \oplus u_1 \oplus u_2 \oplus u_3 \oplus u_4 \oplus u_5 \oplus u_6 \oplus u_7;$$

$$K = u_1 \oplus u_3 \oplus u_5 \oplus u_7;$$

$$L = u_2 \oplus u_3 \oplus u_6 \oplus u_7;$$

$$M = u_3 \oplus u_7;$$

$$O = u_4 \oplus u_5 \oplus u_6 \oplus u_7;$$

$$P = u_5 \oplus u_7; \text{ and}$$

$$Q = u_6 \oplus u_7$$

where, in this example, A represents the output of the exclusive or function of the hard decision bits $u_0$ and $u_1$ or the output of an exclusive or function of resulting feedback bits from feeding back the hard decision bits $u_0$ and $u_1$ through decoding architecture 400. Likewise, B represents the output of the exclusive or function of the hard decision bits $u_0, u_1, u_2,$ and $u_3$ or the output of the exclusive or function of resulting feedback bits based on the hard decision bits $u_0, u_1, u_2,$ and $u_3$, and so on for C through R.

As illustrated for decoding architecture 400, the two following functions (the output of which are soft values) may be defined:

$$f_o = f(L_1, L_2), \text{ where } f(L_1, L_2) = \text{sign}(L_1) \cdot \text{sign}(L_2) \cdot \min(|L_1|, |L_2|)$$

$$g_o = g(L_1, L_2, b), \text{ where } g(L_1, L_2, b) = (-1)^b \cdot L_1 + L_2,$$

where b may be 0 or 1 where $L_1$ is a first of two inputs (e.g., one of soft inputs $d_0, d_1, \ldots, d_{15}$) as indicated in decoding architecture 400, and $L_2$ is a second of two inputs (e.g., a second one of soft inputs $d_0, d_1, \ldots, d_{15}$) as indicated in decoding architecture 400. For example, the value off at 410 is calculated according to the equation $f_o = f(L_1, L_2)$ above based on the value off calculated at 415 ($L_1$) and the value off calculated at 420 ($L_2$). At 425 the hard decision bits are determined. As another example, the value off at 430 is calculated according to the equation $f_o = f(L_1, L_2)$ where the soft inputs are $L_1 = d_0$ and $L_2 = d_8$.

A PM associated with the decoding architecture 400 may be defined as a log ratio of probability or conditioning probability (e.g., $PM(u_1^i) = -\ln(\Pr\{u_1^i | y_1^N\})$, where $y_1^N$ corresponds to a received sequence $y_1$ to $y_N$). The PM may be determined or calculated according to the following:

If $u_i$ is an information bit, or a correct frozen bit, and $$(1-2u_i) = \text{sign}(L_N^{(i)}(y_1^N, u_1^{i-1})), \text{then} \quad PM(u_1^i) = PM(u_1^{i-1});$$

If $u_i$ is an information bit, or a correct frozen bit, and $$(1-2u_i) \neq \text{sign}(L_N^{(i)}(y_1^N, u_1^{i-1})), \text{then} \quad PM(u_1^i) = PM(u_1^{i-1}) + |L_N^{(i)}(y_1^N, u_1^{i-1})|; \text{ and}$$

If $u_i$ is an incorrect frozen bit, then PM ($u_1^i$) takes the maximum positive number of the given bit-width.

Using decoding architecture 400, in some examples the minimum amount of memory storage registers for processing code block length N code may be N/2.

Figure 5:
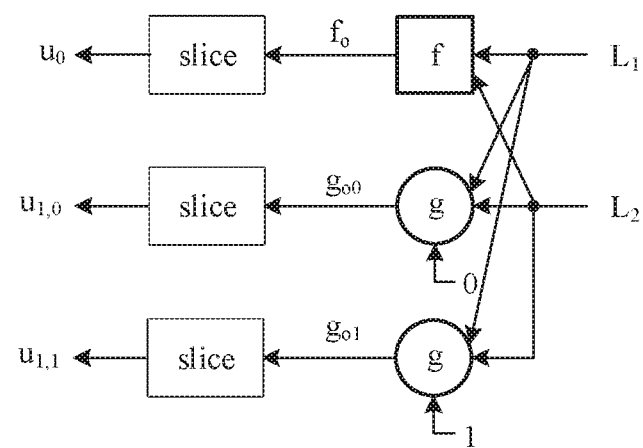
FIG. 5 illustrates an example of a decoder block to decode 2-bits at a time to implement early termination techniques for successive decoding processes in accordance with various aspects of the present disclosure.

FIG. 5 illustrates an example of a decoder block 500 to decode 2-bits at a time to implement early termination techniques for successive decoding processes in accordance with various aspects of the present disclosure. Decoder block 500 may illustrate, for example, a portion of decoding architecture 400 for list processing. For a list decoder, the determination of subsequent hard decision bits may depend on the determination of one or more prior hard decision bits. For example, as illustrated for decoding architecture 400, the determination of $u_1$ depends on the prior determination of $u_0$. In particular the calculation at 450 takes as one of its inputs $u_0$. The other inputs at 450 may depend on prior calculations of the value off (for example based on the respective values of $L_1$ and $L_2$) at different points in the decoding architecture 400 but do not require a determination of the value of $u_0, u_1, \ldots,$ or $u_{15}$.

In the example of decoder block 500 to decode 2-bits at a time, part of the circuit to calculate $u_1$ may be duplicated. For $u_0$, the calculation of $f_0$ based on inputs $L_1$ and $L_2$ may occur. For $u_1$, the calculation of $g_0$ based on inputs $L_1$, $L_2$, and $u_0$ may occur in parallel or concurrently with the calculation of $u_0$ by calculating two possible values for $u_1$, assuming in one case, $u_{1,0}$, that the hard decision bit value of $u_0$ will be a "0", and in a second case, $u_{1,1}$, assuming that the hard decision bit value of $u_0$ will be a "1". Thus, the calculation of $g_{o0}$ is based on inputs $L_1, L_2$, and $u_0=0$, and the calculation of $g_{o1}$ is based on inputs $L_1, L_2$, and $u_0=1$. By duplicating part of the circuit, the calculation for $u_1$ is no longer waiting for the result of the calculation of $u_0$. The PMs of the candidate decoding paths associated with $u_0$ and $u_1$ may be calculated, two PMs for the $u_1$ associated with the assumed value of $u_0=0$ and two PMs for $u_1$ associated with the assumed value of $u_0=1$.

Decoder block 500 illustrates decoding two bits at a time covering four list decoding paths. In some examples, a decoder may decode four bits at a time covering sixteen list decoding paths. In other examples, the decoder may be configured to decode other numbers of bits, whether an even number or an odd number, at the same time, generating a different number of list decoding paths for each candidate path used as a basis for the decoding stage. For example, for decoding two bits at a time, the number of candidate paths will double at each decoding stage and the N candidate paths having the highest PMs may be selected for the next stage, where N is the list size. The list size N and the number of bits to decode at a time may be selected based on decoder processing and memory constraints, desired decoding latency, or a combination of these.

Figure 6:
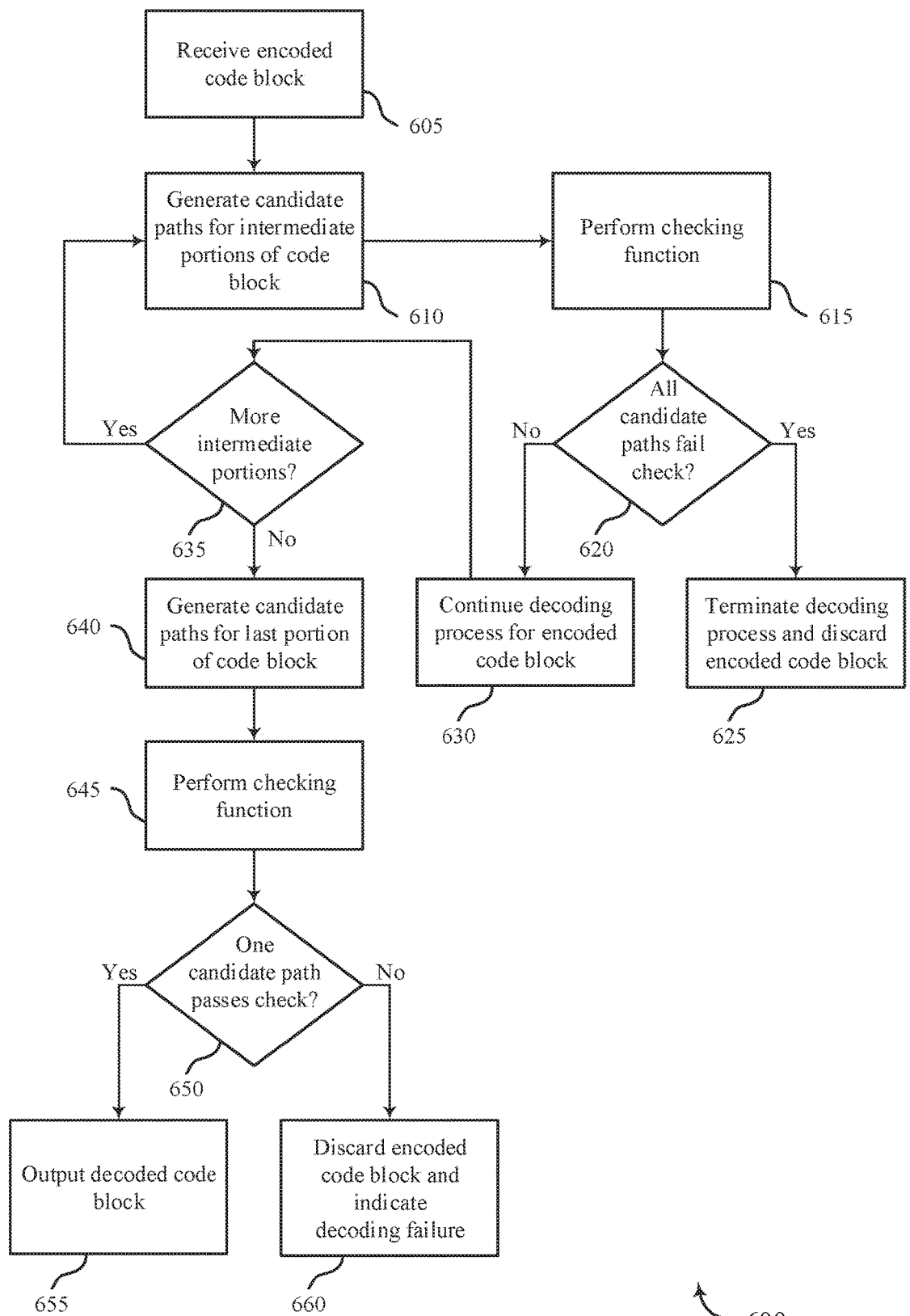
FIG. 6 illustrates an example of a flow to implement early termination techniques for successive decoding processes in accordance with various aspects of the present disclosure.

FIG. 6 illustrates an example of a flow 600 to implement early termination techniques for successive decoding processes in accordance with various aspects of the present disclosure. Flow 600 may be implemented by a decoder 200 or a wireless device, including wireless device 705, a wireless device 805, a UE 115, or a base station 105 as described with reference to FIGS. 1 through 5 and 7 through 10, or their components as described herein.

At 605, a wireless device may receive an encoded code block. The code block may contain multiple data portions and multiple data check portions corresponding to the multiple data portions, as further described above, for example as described with reference to FIGS. 3A through 3C. For example, the code block may contain a first data portion, a first data check portion, a second data portion, and a second data check portion as described with reference to FIG. 3A. In other example, the code block may have any other number of data portions and corresponding data check portions. The respective data check portions of the code block may correspond to one or more of the data portions. The encoded code block may have been encoded at the transmitting wireless device according to an encoding algorithm for which a non-backtracking decoding algorithm can be applied, for example a polar code or a CC.

At 610, the decoder of the wireless device (e.g., the inner decoder 205 of the decoder) may generate one or more candidate paths for an intermediate portion of the code block, wherein the code block includes an intermediate data portion and respective intermediate data check portion for the intermediate portion. The decoder may start with the first portion of the code block, including the first data portion and first respective data check portion for the encoded code block. An intermediate portion of the code block may be those portions of the code block prior to the last portion of the code block, where the last portion of the code block may include, in addition to a last data portion, a data check portion for the whole of the data portions of the code block. In some examples, the data check portions for the intermediate portions may apply only to the immediately preceding data portion, whereas the last data check portion applies to the data portions of both all the intermediate data portions and the last data portion. In other examples, each data check portion for the intermediate portions may apply to all preceding data portions.

At 615, a checking function may be performed (e.g., by a checking function processor 210 of the decoder) on the first data portion using the first respective data check portion, which may be performed for each of the candidate paths. As further described above, in the some examples, the first data check portion may include a number of CRC bits such that the checking function is a CRC function on the first data portion.

At 620, the decoder may determine (e.g., by a checking function processor 210 of the decoder) whether all the candidate paths generated by the inner decoder fail the checking function. In some examples, where the checking function fails for all the candidate paths generated for the code block, it may not be possible for the encoded code block to pass the checking function for the full data portion of the code block once the decoding process has finished and the final checking function is to be performed on the whole data portion of the code block.

At 625, if the decoder determines that all the candidate paths will fail the checking function, then the decoding process may be terminated (e.g., by a decoding controller 215 of the decoder), and the encoded code block discarded.

At 630, if the decoder determines that fewer than all the candidate paths will fail the checking function, then the decoding process may continue. Decoding may continue as long as one or more of the candidate paths passes the checking function performed on the first portion of the code block, as it may be possible for one or more of the candidate paths to pass the checking function for the entirety of the data portions of the code block for a final data check. From block 630, flow 600 may continue to block 635.

At 635, the decoder may determine whether more intermediate portions remain for the encoded code block. If there are further intermediate portions, then the decoder may return to 610 and generate candidate paths for the next intermediate portion of the code block. The candidate paths for the next intermediate portion are generated starting from the candidate paths of the earlier intermediate portion. For example, where the decoder previously generated one or more candidate paths for a first portion, including a first data portion and a first data check portion, the decoder may next generate one or more candidate paths for a second portion using the bit values of the previous one or more candidate paths as input. The second portion may include a second data portion and a second data check portion. As for the first portion, after generating the candidate paths for the second portion, the flow may proceed to 615 to perform the checking function, checking the second data portion using respective second data check portions, and so on.

The decoder may continue to generate candidate paths for intermediate portions, returning to 610, for each of the intermediate portions of the encoded code block until reaching the last portion of the code block, for example where all intermediate portions of the encoded block have had candidate paths generated. Intermediate portions of the code block may, for example, correspond to one or more of portion 305, portion 325, portion 330, portion 340, or portion 345 as described with reference to FIGS. 3A through 3C.

At 640, the decoder of the wireless device (e.g., the inner decoder 205 of the decoder) may generate one or more candidate paths for the last portion of the code block, including a last data portion and a respective last data check portion for the intermediate portion. The last portion of the encoded code block may, for example, correspond to one of portion 310, portion 335, or portion 350 as described with reference to FIGS. 3A, 3B, and 3C, respectively. In addition to a last data portion, the last portion of the code block may include a data check portion. In some examples, the last data check portion may include a number of data check (e.g., CRC) bits such that the checking function for the last data check portion checks the entirety of the hard decision bits associated with each of the candidate data paths. At 645, the multiple candidate paths for the entire code block are checked using the last data check portion.

At 650, the decoder may determine whether the hard decision bits associated with one candidate path passes the checking function. If, at 650, the decoder determines that there is one candidate path associated with a successful checking function, then the hard decision bits for the candidate path associated with a successful checking function may be output from the decoder as the decoded code block at 655.

If, at 650, the decoder determines that the hard decision bits for each candidate path have failed the checking function, then the candidate paths for the code block may be discarded, and an indication of decoding failure for the encoded code block may be output from the decoder at 660 (e.g., by decoding controller 215 of the decoder).

The decoder (e.g., by a checking function processor 210 of the decoder) may perform actions related to the checking function concurrently with or partly concurrently with the candidate path generation (e.g., by an inner decoder 205 of the decoder) for the encoded code block. For example, one or more of the action described with reference to 615, 620, 625, and/or 630 may be performed in parallel with or at the same time as one or more of the action described with reference to 610, 635, 640, 645, 650, 655, and/or 660. In some examples, generating candidate paths for intermediate portions of the encoded code block may continue regardless of whether the checking function is being performed for earlier generated candidate paths.

Figure 7:
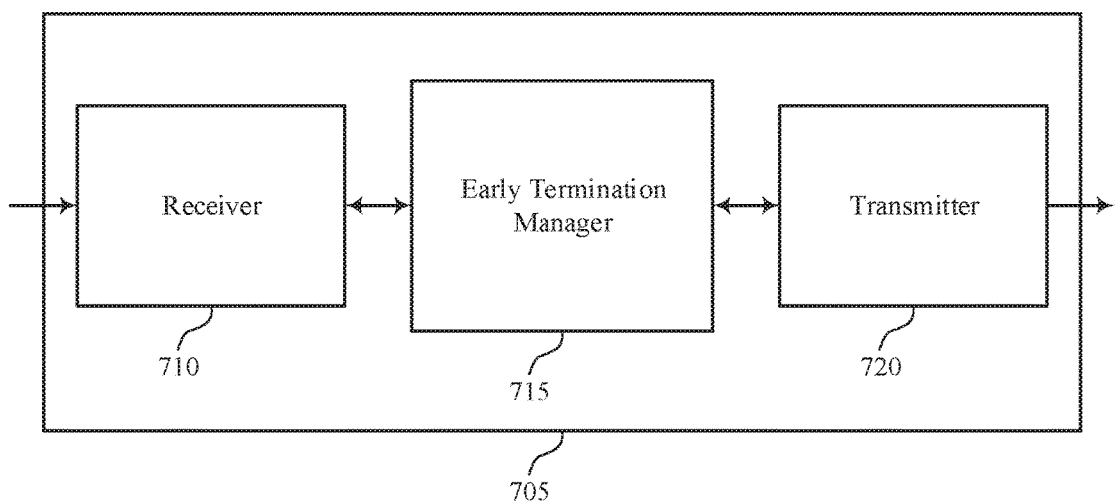
FIGS. 7 through 9 illustrate block diagrams of a device that supports early termination techniques for successive decoding processes in accordance with various aspects of the present disclosure.

FIG. 7 shows a block diagram 700 of a wireless device 705 that supports early termination techniques for successive decoding processes in accordance with various aspects of the present disclosure. Wireless device 705 may be an example of aspects of a UE 115 or a base station 105 as described with reference to FIG. 1. Wireless device 705 may include receiver 710, early termination manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to early termination techniques for successive decoding processes, etc.). Information may be passed on to other components of the device. The receiver 710 may be an example of aspects of the transceiver 1035 described with reference to FIG. 10.

Early termination manager 715 may be an example of aspects of the early termination manager 1015 described with reference to FIG. 10. Early termination manager 715 may initiate a decoding process for an encoded code block received at the wireless device; generate, using a decoder, one or more candidate paths for a first portion of the code block, where the first portion of the code block includes a first data portion and a first data check portion; perform a checking function on respective first data portions for the one or more candidate paths using respective first data check portions; and determine whether to terminate the decoding process prior to completing decoding the code block based on determining whether the checking function for each of the one or more candidate paths for the first data portion has failed the checking function.

Transmitter 720 may transmit signals generated by other components of the device. In some examples, the transmitter 720 may be collocated with a receiver 710 in a transceiver module. For example, the transmitter 720 may be an example of aspects of the transceiver 1035 described with reference to FIG. 10. The transmitter 720 may include a single antenna, or it may include a set of antennas.

Figure 8:
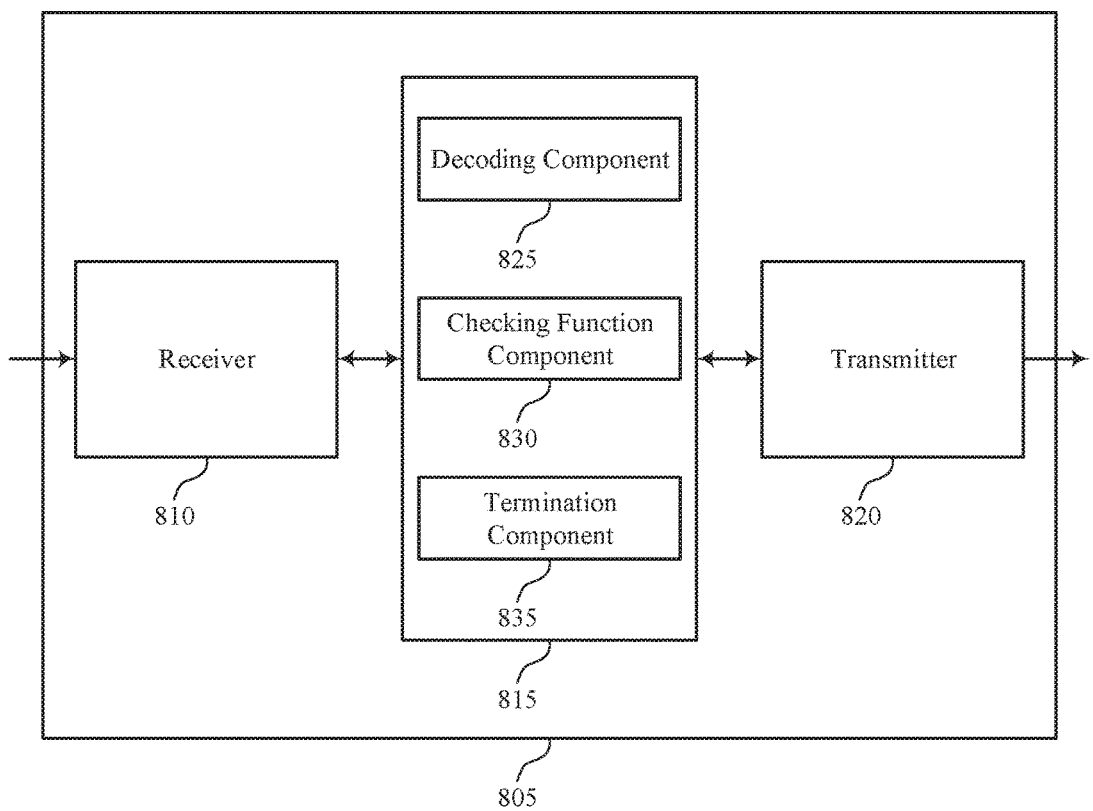

FIG. 8 shows a block diagram 800 of a wireless device 805 that supports early termination techniques for successive decoding processes in accordance with various aspects of the present disclosure. Wireless device 805 may be an example of aspects of a wireless device 705, a UE 115, or a base station 105 as described with reference to FIGS. 1 and 7. Wireless device 805 may include receiver 810, early termination manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to early termination techniques for successive decoding processes, etc.). Information may be passed on to other components of the device. The receiver 810 may be an example of aspects of the transceiver 1035 described with reference to FIG. 10.

Early termination manager 815 may be an example of aspects of the early termination manager 1015 described with reference to FIG. 10. Early termination manager 815 may also include decoding component 825, checking function component 830, and termination component 835.

Decoding component 825 may initiate a decoding process for an encoded code block received at the wireless device and generate, using a decoder, one or more candidate paths for a first portion of the encoded code block, where the first portion of the code block includes a first data portion and a first data check portion. Decoding component 825 may additionally generate, using the decoder, a second one or more candidate paths for a second portion of the code block, where the second portion of the code block includes a second data portion and a second data check portion. In some cases, the decoder includes a polar decoder or a CC decoder. In some cases, the decoder implements a non-backtracking decoding algorithm.

Checking function component 830 may perform a checking function on respective first data portions for the one or more candidate paths using respective first data check portions and may perform the checking function on respective second data portions for the one or more candidate paths for the second portion using respective second data check portions. In some cases, each of the set of data check portions have a same number of data check bits. In some cases, at least one of the set of data check portions have a different number of data check bits than at least one other data check portion of the set of data check portions. In some cases, the checking function includes a CRC.

Termination component 835 may determine whether to terminate the decoding process prior to completing decoding the encoded code block based on determining whether the checking function for each of the one or more candidate paths for the first data portion has failed the checking function. Termination component 835 may additionally determine whether to terminate the decoding process prior to completing decoding the encoded code block based on determining whether the checking function for each of the one or more candidate paths for the second data portion has failed the checking function.

Transmitter 820 may transmit signals generated by other components of the device. In some examples, the transmitter 820 may be collocated with a receiver 810 in a transceiver module. For example, the transmitter 820 may be an example of aspects of the transceiver 1035 described with reference to FIG. 10. The transmitter 820 may include a single antenna, or it may include a set of antennas.

Figure 9:
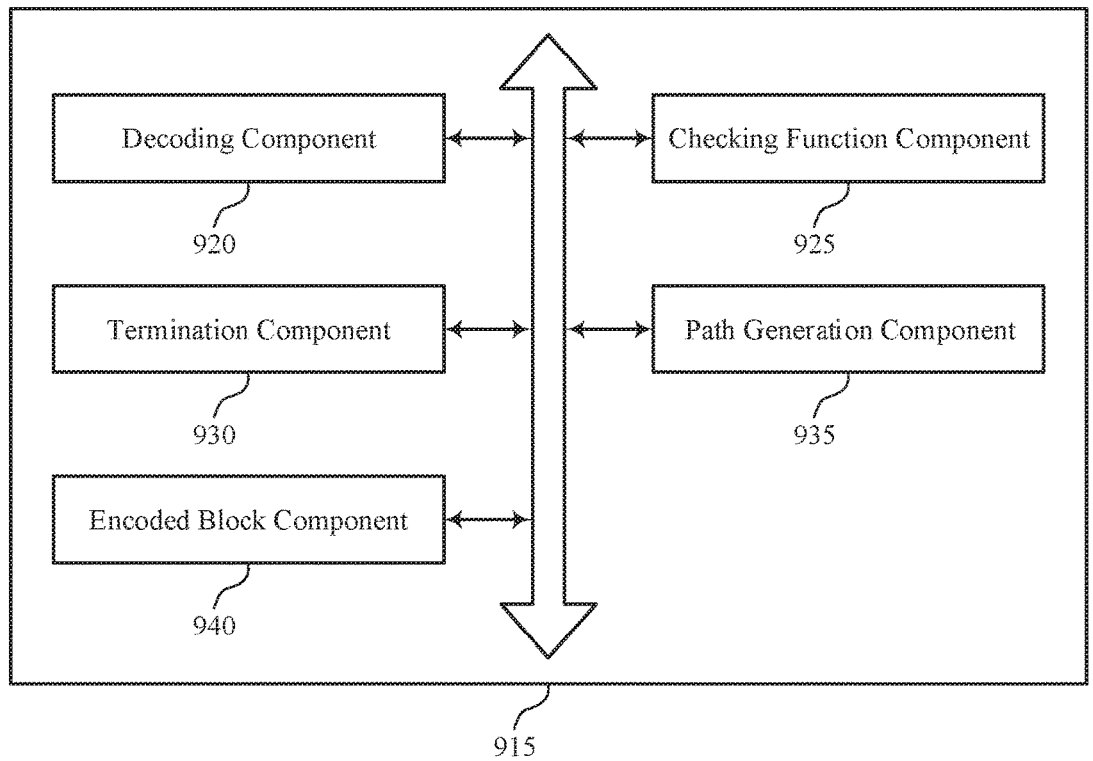

FIG. 9 shows a block diagram 900 of an early termination manager 915 that supports early termination techniques for successive decoding processes in accordance with various aspects of the present disclosure. The early termination manager 915 may be an example of aspects of an early termination manager 715, an early termination manager 815, or an early termination manager 1015 described with reference to FIGS. 7, 8, and 10. The early termination manager 915 may include decoding component 920, checking function component 925, termination component 930, path generation component 935, and encoded block component 940. Each of these modules may communicate, directly or indirectly, with one another (e.g., via one or more buses).

Decoding component 920 may initiate a decoding process for an encoded code block received at the wireless device and may generate, using a decoder, one or more candidate paths for a first portion of the code block, where the first portion of the code block includes a first data portion and a first data check portion. Decoding component 920 may further generate, using the decoder, a second one or more candidate paths for a second portion of the encoded code block, where the second portion of the code block includes a second data portion and a second data check portion. In some cases, the decoder includes a polar decoder or a CC decoder. In some cases, the decoder implements a non-backtracking decoding algorithm.

Checking function component 925 may perform a checking function on respective first data portions for the one or more candidate paths using respective first data check portions and may perform the checking function on respective second data portions for the one or more candidate paths for the second portion using respective second data check portions. In some cases, each of the set of data check portions have a same number of data check bits. In some cases, at least one of the set of data check portions have a different number of data check bits than at least one other data check portion of the set of data check portions. In some cases, the checking function includes a CRC.

Termination component 930 may determine whether to terminate the decoding process prior to completing decoding the encoded code block based on determining whether the checking function for each of the one or more candidate paths for the first data portion has failed the checking function. Termination component 930 may further determine whether to terminate the decoding process prior to completing decoding the encoded code block based on determining whether the checking function for each of the one or more candidate paths for the second data portion has failed the checking function.

Path generation component 935 may generate a second one or more candidate paths for the second portion of the code block, where the second portion of the code block includes a second data portion and a second data check portion, and where the second one or more candidate paths are initialized from the first one or more candidate paths. In some cases, the generating of at least a part of the second one or more candidate paths is performed concurrently with performing the checking function on the respective first data portions for the one or more candidate paths using the respective first data check portions. In some cases, the second one or more candidate paths are initialized from a subset of the first one or more candidate paths for which the checking function has passed. In some cases, the one or more candidate paths include a set of candidate paths.

Encoded block component 940 may receive a control channel of a wireless transmission, where the encoded code block is received in the control channel. In some cases, the code block includes a set of data portions, including the first data portion, and a set of data check portions associated with respective ones of the set of data portions, including the first data check portion. In some cases, each of the set of data portions are a same size. In some cases, at least one of the set of data portions have a different size than at least one other data portion of the set of data portions.

Figure 10:
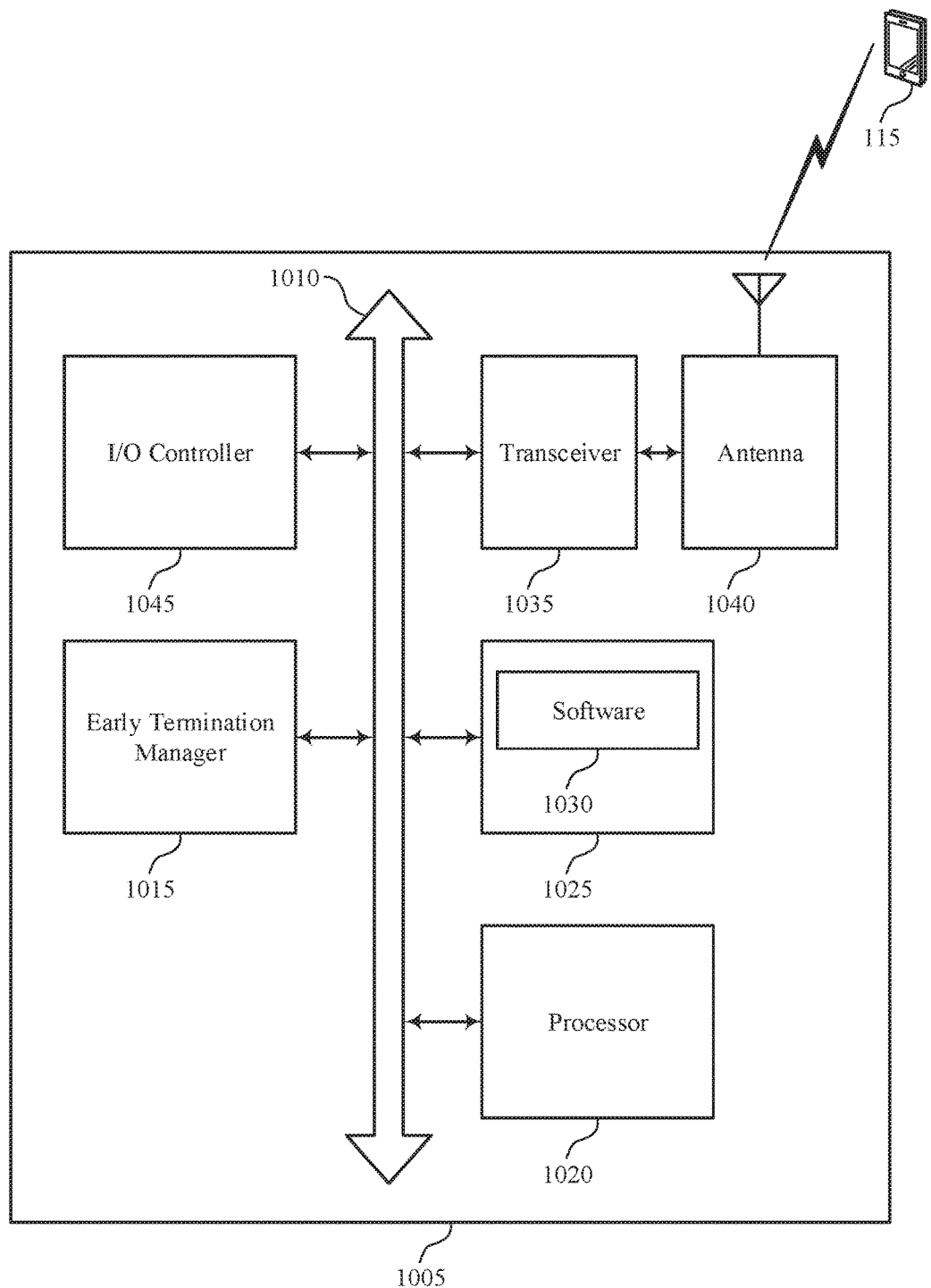
FIG. 10 illustrates a block diagram of a system including a wireless device that supports early termination techniques for successive decoding processes in accordance with various aspects of the present disclosure.

FIG. 10 shows a diagram of a system 1000 including a device 1005 that supports early termination techniques for successive decoding processes in accordance with various aspects of the present disclosure. Device 1005 may be an example of or include the components of wireless device 705, wireless device 805, a UE 115, or a base station 105 as described above, e.g., with reference to FIGS. 1, 7, and 8. Device 1005 may include components for bi-directional voice and data communications including components for transmitting and receiving communications, including early termination manager 1015, processor 1020, memory 1025, software 1030, transceiver 1035, antenna 1040, and I/O controller 1045.

Processor 1020 may include an intelligent hardware device, (e.g., a general-purpose processor, a digital signal processor (DSP), a central processing unit (CPU), a microcontroller, an application specific integrated circuit (ASIC), a field-programmable gate array (FPGA), a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting early termination techniques for successive decoding processes).

Memory 1025 may include random access memory (RAM) and read only memory (ROM). The memory 1025 may store computer-readable, computer-executable software 1030 including instructions that, when executed, cause the processor to perform various functions described herein. In some cases, the memory 1025 may contain, among other things, a Basic Input-Output system (BIOS) which may control basic hardware and/or software operation such as the interaction with peripheral components or devices.

Software 1030 may include code to implement aspects of the present disclosure, including code to support early termination techniques for successive decoding processes. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described above. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

In some cases, the wireless device may include a single antenna 1040. However, in some cases the device may have more than one antenna 1040, which may be capable of concurrently transmitting or receiving multiple wireless transmissions (e.g., with a UE 115).

I/O controller 1045 may manage input and output signals for device 1005. I/O controller 1045 may also manage peripherals not integrated into device 1005. In some cases, I/O controller 1045 may represent a physical connection or port to an external peripheral. In some cases, I/O controller 1045 may utilize an operating system such as iOS®, ANDROID®, MS-DOS®, MS-WINDOWS®, OS/2®, UNIX®, LINUX®, or another known operating system.

Figure 11:
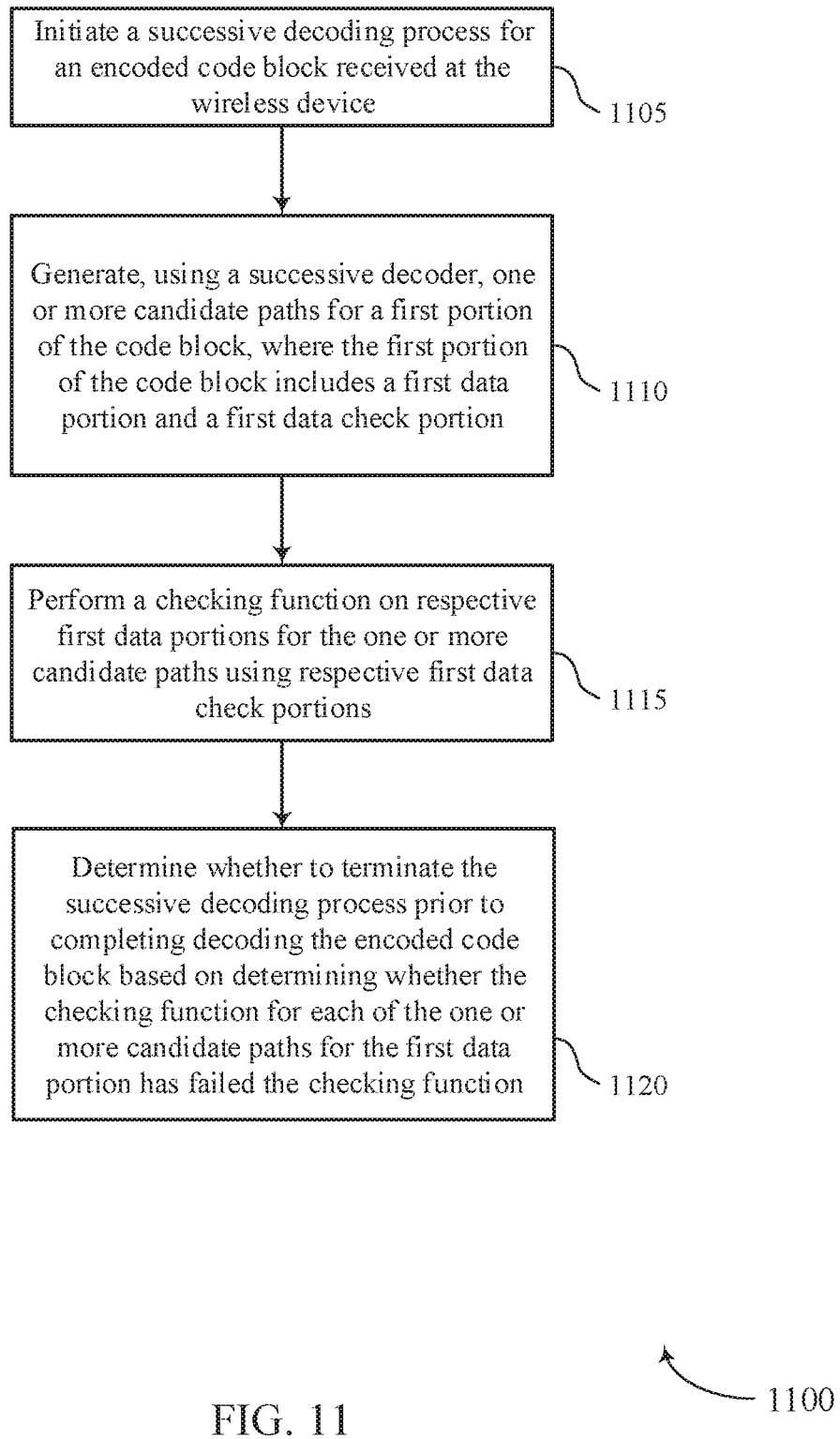
FIG. 11 illustrates methods for early termination techniques for successive decoding processes in accordance with various aspects of the present disclosure.

FIG. 11 shows a flowchart illustrating a method 1100 for early termination techniques for successive decoding processes in accordance with various aspects of the present disclosure. The operations of method 1100 may be implemented by a wireless device 705, a wireless device 805, a device 1005, a UE 115, or a base station 105 as described with reference to FIG. 1 through 10, or their components as described herein. For example, the operations of method 1100 may be performed by an early termination manager as described with reference to FIGS. 7 through 10. In some examples a UE 115 or a base station 105 may execute a set of codes to control the functional elements of the device to perform the functions described below.

At block 1105 the UE 115 or base station 105 may initiate a successive decoding process for an encoded code block received at the wireless device. The operations of block 1105 may be performed according to the methods described with reference to FIGS. 1 through 6. In certain examples, aspects of the operations of block 1105 may be performed by a decoding component as described with reference to FIGS. 7 through 10.

At block 1110 the UE 115 or base station 105 may generate, using a successive decoder, one or more candidate paths for a first portion of the code block, wherein the first portion of the code block comprises a first data portion and a first data check portion. The operations of block 1110 may be performed according to the methods described with reference to FIGS. 1 through 6. In certain examples, aspects of the operations of block 1110 may be performed by a decoding component as described with reference to FIGS. 7 through 10.

At block 1115 the UE 115 or base station 105 may perform a checking function on respective first data portions for the one or more candidate paths using respective first data check portions. The operations of block 1115 may be performed according to the methods described with reference to FIGS. 1 through 6. In certain examples, aspects of the operations of block 1115 may be performed by a checking function component as described with reference to FIGS. 7 through 10.

At block 1120 the UE 115 or base station 105 may determine whether to terminate the successive decoding process prior to completing decoding the encoded code block based at least in part on determining whether the checking function for each of the one or more candidate paths for the first data portion has failed the checking function. The operations of block 1120 may be performed according to the methods described with reference to FIGS. 1 through 6. In certain examples, aspects of the operations of block 1120 may be performed by a termination component as described with reference to FIGS. 7 through 10.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code-division multiple access (CDMA), time-division multiple access (TDMA), frequency-division multiple access (FDMA), orthogonal frequency-division multiple access (OFDMA), single carrier frequency division multiple access (SC-FDMA), and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1×, etc. IS-856 (TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications system (UMTS). 3GPP LTE and LTE-Advanced (LTE-A) are new releases of Universal Mobile Telecommunications System (UMTS) that use E-UTRA. UTRA, E-UTRA, UMTS, LTE, LTE-A, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects an LTE system may be described for purposes of example, and LTE terminology may be used in much of the description, the techniques described herein are applicable beyond LTE applications.

In LTE/LTE-A networks, including such networks described herein, the term eNB may be generally used to describe the base stations. The wireless communications system or systems described herein may include a heterogeneous LTE/LTE-A network in which different types of eNBs provide coverage for various geographical regions. For example, each eNB or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNB, Home NodeB, a Home eNodeB, or some other suitable terminology. The geographic coverage area for a base station may be divided into sectors making up only a portion of the coverage area. The wireless communications system or systems descrbed herein may include base stations of different types (e.g., macro or small cell base stations). The UEs described herein may be able to communicate with various types of base stations and network equipment including macro eNBs, small cell eNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers). A UE may be able to communicate with various types of base stations and network equipment including macro eNBs, small cell eNBs, relay base stations, and the like.

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and decoder 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a wireless device, comprising:

receiving, at the wireless device, an encoded code block;

initiating a successive decoding process for the code block received at the wireless device;

generating, using a successive decoder, one or more first candidate paths for a first portion of the code block, wherein the first portion of the code block comprises a first data portion and a first data check portion;

performing a checking function on respective first data portions for the one or more first candidate paths using respective first data check portions;

generating, concurrent to the performing the checking function, one or more second candidate paths for a second portion of the code block, wherein the one or more second candidate paths are initialized from the one or more first candidate paths; and determining whether to terminate the successive decoding process prior to completing decoding the code block based at least in part on the one or more second candidate paths and determining whether the checking function for each of the one or more first candidate paths for the first data portion has failed the checking function.

2. The method of claim 1, wherein the second portion of the code block comprises a second data portion and a second data check portion, the method further comprising:

performing the checking function on respective second data portions for the one or more second candidate paths using respective second data check portions; and determining whether to terminate the successive decoding process prior to completing decoding the code block based at least in part on determining whether the checking function for each of the one or more second candidate paths for the second data portion has failed the checking function.

3. The method of claim 1, wherein the second portion of the code block comprises a second data portion and a second data check portion.

4. The method of claim 1, wherein the code block comprises a plurality of data portions, including the first data portion, and a plurality of data check portions associated with respective ones of the plurality of data portions, including the first data check portion.

5. The method of claim 4, wherein each of the plurality of data portions are a same size.

6. The method of claim 4, wherein at least one of the plurality of data portions have a different size than at least one other data portion of the plurality of data portions.

7. The method of claim 4, wherein each of the plurality of data check portions have a same number of data check bits.

8. The method of claim 4, wherein at least one of the plurality of data check portions have a different number of data check bits than at least one other data check portion of the plurality of data check portions.

9. The method of claim 1, wherein the one or more first candidate paths comprise a plurality of candidate paths.

10. The method of claim 1, wherein the checking function comprises a cyclic redundancy check (CRC).

11. The method of claim 1, wherein the decoder comprises a polar decoder or a convolutional code (CC) decoder.

12. The method of claim 1, wherein the decoder implements a non-backtracking decoding algorithm.

13. The method of claim 1, further comprising:

receiving a control channel of a wireless transmission, wherein the code block is received in the control channel.

14. An apparatus for wireless communication at a wireless device, comprising:

means for receiving, at the wireless device, an encoded code block;

means for initiating a successive decoding process for the code block received at the wireless device;

means for generating, using a successive decoder, one or more first candidate paths for a first portion of the code block, wherein the first portion of the code block comprises a first data portion and a first data check portion;

means for performing a checking function on respective first data portions for the one or more first candidate paths using respective first data check portions;

means for generating, concurrent to the performing the checking function, one or more second candidate paths for a second portion of the code block, wherein the one or more second candidate paths are initialized from the one or more first candidate paths; and means for determining whether to terminate the successive decoding process prior to completing decoding the code block based at least in part on the one or more second candidate paths and determining whether the checking function for each of the one or more first candidate paths for the first data portion has failed the checking function.

15. The apparatus of claim 14, wherein the second portion of the code block comprises a second data portion and a second data check portion, the apparatus further comprising:

means for performing the checking function on respective second data portions for the one or more second candidate paths using respective second data check portions; and means for determining whether to terminate the successive decoding process prior to completing decoding the code block based at least in part on determining whether the checking function for each of the one or more second candidate paths for the second data portion has failed the checking function.

16. The apparatus of claim 14, wherein the second portion of the code block comprises a second data portion and a second data check portion.

17. The apparatus of claim 14, wherein the code block comprises a plurality of data portions, including the first data portion, and a plurality of data check portions associated with respective ones of the plurality of data portions, including the first data check portion.

18. The apparatus of claim 17, wherein each of the plurality of data portions are a same size.

19. The apparatus of claim 17, wherein at least one of the plurality of data portions have a different size than at least one other data portion of the plurality of data portions.

20. The apparatus of claim 17, wherein each of the plurality of data check portions have a same number of data check bits.

21. The apparatus of claim 17, wherein at least one of the plurality of data check portions have a different number of data check bits than at least one other data check portion of the plurality of data check portions.

22. The apparatus of claim 14, wherein the one or more first candidate paths comprise a plurality of candidate paths.

23. The apparatus of claim 14, wherein the checking function comprises a cyclic redundancy check (CRC).

24. The apparatus of claim 14, wherein the decoder comprises a polar decoder or a convolutional code (CC) decoder.

25. The apparatus of claim 14, wherein the decoder implements a non-backtracking decoding algorithm.

26. The apparatus of claim 14, further comprising:
means for receiving a control channel of a wireless transmission, wherein the code block is received in the control channel.

27. An apparatus for wireless communication at a wireless device, in a system comprising:
a processor;
memory in electronic communication with the processor; and
instructions stored in the memory and operable, when executed by the processor, to cause the apparatus to:
receive, at the wireless device, an encoded code block;
initiate a successive decoding process for the code block received at the wireless device;
generate, using a successive decoder, one or more first candidate paths for a first portion of the code block, wherein the first portion of the code block comprises a first data portion and a first data check portion;
perform a checking function on respective first data portions for the one or more first candidate paths using respective first data check portions;
generate, concurrent to the performing the checking function, one or more second candidate paths for a second portion of the code block, wherein the one or more second candidate paths are initialized from the one or more first candidate paths; and
determine whether to terminate the successive decoding process prior to completing decoding the code block based at least in part on the one or more second candidate paths and determining whether the checking function for each of the one or more first candidate paths for the first data portion has failed the checking function.

28. The apparatus of claim 27,
wherein the second portion of the code block comprises a second data portion and a second data check portion, the instructions further executable by the processor to:
perform the checking function on respective second data portions for the one or more second candidate paths using respective second data check portions; and
determine whether to terminate the successive decoding process prior to completing decoding the code block based at least in part on determining whether the checking function for each of the one or more second candidate paths for the second data portion has failed the checking function.

29. The apparatus of claim 27,
wherein the second portion of the code block comprises a second data portion and a second data check portion.

30. The apparatus of claim 27, wherein the code block comprises a plurality of data portions, including the first data portion, and a plurality of data check portions associated with respective ones of the plurality of data portions, including the first data check portion.

31. The apparatus of claim 30, wherein each of the plurality of data portions are a same size.

32. The apparatus of claim 30, wherein at least one of the plurality of data portions have a different size than at least one other data portion of the plurality of data portions.

33. The apparatus of claim 30, wherein each of the plurality of data check portions have a same number of data check bits.

34. The apparatus of claim 30, wherein at least one of the plurality of data check portions have a different number of data check bits than at least one other data check portion of the plurality of data check portions.

35. The apparatus of claim 27, wherein the one or more first candidate paths comprise a plurality of candidate paths.

36. The apparatus of claim 27, wherein the checking function comprises a cyclic redundancy check (CRC).

37. The apparatus of claim 27, wherein the decoder comprises a polar decoder or a convolutional code (CC) decoder.

38. The apparatus of claim 27, wherein the decoder implements a non-backtracking decoding algorithm.

39. The apparatus of claim 27, wherein the instructions are further executable by the processor to:
receive a control channel of a wireless transmission, wherein the code block is received in the control channel.

40. A non-transitory computer-readable medium storing code for wireless communication at a wireless device, the code comprising instructions executable by a processor to:
receive, at the wireless device, an encoded code block;
initiate a successive decoding process for the code block received at the wireless device;
generate, using a successive decoder, one or more first candidate paths for a first portion of the code block, wherein the first portion of the code block comprises a first data portion and a first data check portion;
perform a checking function on respective first data portions for the one or more first candidate paths using respective first data check portions;
generate, concurrent to the performing the checking function, one or more second candidate paths for a second portion of the code block, wherein the one or more second candidate paths are initialized from the one or more first candidate paths; and
determine whether to terminate the successive decoding process prior to completing decoding the code block based at least in part on the one or more second candidate paths and determining whether the checking function for each of the one or more candidate paths for the first data portion has failed the checking function.

41. The non-transitory computer-readable medium of claim 40,
wherein the second portion of the code block comprises a second data portion and a second data check portion, the instructions further executable by the processor to:
perform the checking function on respective second data portions for the one or more second candidate paths using respective second data check portions; and
determine whether to terminate the successive decoding process prior to completing decoding the code block based at least in part on determining whether the checking function for each of the one or more second candidate paths for the second data portion has failed the checking function.

42. The non-transitory computer-readable medium of claim 40,
wherein the second portion of the code block comprises a second data portion and a second data check portion.

43. The non-transitory computer-readable medium of claim 40, wherein the code block comprises a plurality of data portions, including the first data portion, and a plurality of data check portions associated with respective ones of the plurality of data portions, including the first data check portion.

44. The non-transitory computer-readable medium of claim 43, wherein each of the plurality of data portions are a same size.

45. The non-transitory computer-readable medium of claim 43, wherein at least one of the plurality of data portions have a different size than at least one other data portion of the plurality of data portions.

46. The non-transitory computer-readable medium of claim 43, wherein each of the plurality of data check portions have a same number of data check bits.

47. The non-transitory computer-readable medium of claim 43, wherein at least one of the plurality of data check portions have a different number of data check bits than at least one other data check portion of the plurality of data check portions.

48. The non-transitory computer-readable medium of claim 40, wherein the one or more first candidate paths comprise a plurality of candidate paths.

49. The non-transitory computer-readable medium of claim 40, wherein the checking function comprises a cyclic redundancy check (CRC).

50. The non-transitory computer-readable medium of claim 40, wherein the decoder comprises a polar decoder or a convolutional code (CC) decoder.

51. The non-transitory computer-readable medium of claim 40, wherein the decoder implements a non-backtracking decoding algorithm.

52. The non-transitory computer-readable medium of claim 40, wherein the instructions are further executable by the processor to:
receive a control channel of a wireless transmission, wherein the code block is received in the control channel.

* * * * *